(12) United States Patent
Whetsel

(10) Patent No.: US 6,769,080 B2
(45) Date of Patent: Jul. 27, 2004

(54) SCAN CIRCUIT LOW POWER ADAPTER WITH COUNTER

(75) Inventor: Lee D. Whetsel, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 488 days.

(21) Appl. No.: 09/803,599

(22) Filed: Mar. 9, 2001

(65) Prior Publication Data

US 2001/0047498 A1 Nov. 29, 2001

Related U.S. Application Data

(60) Provisional application No. 60/187,972, filed on Mar. 9, 2000.

(51) Int. Cl.[7] .................. G01R 31/303; G01R 31/3187
(52) U.S. Cl. ....................................... 714/729; 714/733
(58) Field of Search ............................... 714/724, 726, 714/729, 733, 741

(56) References Cited

U.S. PATENT DOCUMENTS

| | | | |
|---|---|---|---|
| 3,633,100 A | 1/1972 | Heilweil et al. ............... 324/73 |
| 3,651,315 A | 3/1972 | Collins .................. 235/151.31 |
| 3,657,527 A | 4/1972 | Kassabgi et al. ........... 235/153 |
| 3,723,868 A | 3/1973 | Foster .................... 324/73 AT |
| 3,739,193 A | 6/1973 | Pryor .......................... 307/205 |
| 3,789,359 A | 1/1974 | Clark, Jr. et al. ..... 340/146.1 D |
| 3,824,678 A | 7/1974 | Harris et al. ................... 29/578 |
| 3,826,909 A | 7/1974 | Ivashin ................. 235/153 AC |
| 3,831,149 A | 8/1974 | Job ......................... 340/172.5 |
| 3,838,264 A | 9/1974 | Maker ................. 235/153 AM |
| 3,873,818 A | 3/1975 | Barnard ................ 253/153 AC |
| 3,976,940 A | 8/1976 | Chau et al. ............... 324/73 R |
| 4,023,142 A | 5/1977 | Woessner ................ 340/172.5 |
| 4,066,882 A | 1/1978 | Esposito ..................... 235/302 |
| 4,086,375 A | 4/1978 | LaChapelle, Jr. et al. ..... 427/90 |
| 4,092,733 A | 5/1978 | Coontz et al. ............... 365/200 |
| 4,108,359 A | 8/1978 | Proto .......................... 235/304 |
| 4,146,835 A | 3/1979 | Chnapko et al. .......... 324/73 R |

(List continued on next page.)

FOREIGN PATENT DOCUMENTS

| EP | 0136174 | 4/1985 | ............. G06F/9/30 |
|---|---|---|---|
| EP | 0148403 | 7/1985 | ........... G01R/31/28 |

(List continued on next page.)

OTHER PUBLICATIONS

Adshead, Dave, "Embedded Systems: JTAG Accelerates Debugging Process," Electronic Engineering Times, Jun. 22, 1998, pp 106.

(List continued on next page.)

*Primary Examiner*—Albert Decady
*Assistant Examiner*—Cynthia Britt
(74) *Attorney, Agent, or Firm*—Lawrence J. Bassuk; W. James Brady; Frederick J. Telecky, Jr.

(57) ABSTRACT

Scan architectures are commonly used to test digital circuitry in integrated circuits. The present invention describes a method of adapting conventional scan architectures into a low power scan architecture. The low power scan architecture maintains the test time of conventional scan architectures, while requiring significantly less operational power than conventional scan architectures. The low power scan architecture is advantageous to IC/die manufacturers since it allows a larger number of circuits (such as DSP or CPU core circuits) embedded in an IC/die to be tested in parallel without consuming too much power within the IC/die. Since the low power scan architecture reduces test power consumption, it is possible to simultaneously test more die on a wafer than previously possible using conventional scan architectures. This allows wafer test times to be reduced which reduces the manufacturing cost of each die on the wafer.

5 Claims, 11 Drawing Sheets

U.S. PATENT DOCUMENTS

| | | | |
|---|---|---|---|
| 4,161,276 A | 7/1979 | Sacher et al. | 235/302 |
| 4,216,539 A | 8/1980 | Raymond et al. | 371/20 |
| 4,242,751 A | 12/1980 | Henckels et al. | 371/26 |
| 4,264,807 A | 4/1981 | Moen et al. | 235/92 GD |
| 4,268,902 A | 5/1981 | Berglund et al. | 364/200 |
| 4,286,173 A | 8/1981 | Oka et al. | 307/440 |
| 4,308,616 A | 12/1981 | Timoc | 371/23 |
| 4,309,767 A | 1/1982 | Andow et al. | 371/24 |
| 4,312,066 A | 1/1982 | Bantz et al. | 371/16 |
| 4,339,710 A | 7/1982 | Hapke | 324/73 R |
| RE31,056 E | 10/1982 | Chau et al. | 324/73 R |
| 4,357,703 A | 11/1982 | Van Brunt | 371/15 |
| 4,365,334 A | 12/1982 | Smith et al. | 371/27 |
| 4,366,478 A | 12/1982 | Masuda et al. | 340/825 |
| 4,390,969 A | 6/1983 | Hayes | 395/550 |
| 4,426,697 A | 1/1984 | Petersen et al. | 340/825.52 |
| 4,433,413 A | 2/1984 | Fasang | 371/25 |
| 4,439,858 A | 3/1984 | Petersen | 371/20 |
| 4,441,075 A | 4/1984 | McMahon | 324/73 R |
| 4,483,002 A | 11/1984 | Groom, Jr. et al. | 371/29 |
| 4,484,329 A | 11/1984 | Slamka et al. | 371/25 |
| 4,488,259 A | 12/1984 | Mercy | 364/900 |
| 4,493,077 A | 1/1985 | Agrawal et al. | 371/25 |
| 4,494,066 A | 1/1985 | Goel et al. | 324/73 R |
| 4,498,172 A | 2/1985 | Bhavsar | 371/25 |
| 4,503,536 A | 3/1985 | Panzer | 371/25 |
| 4,504,784 A | 3/1985 | Goel et al. | 324/73 R |
| 4,513,373 A | 4/1985 | Sheets | 364/200 |
| 4,513,418 A | 4/1985 | Bardell, Jr. et al. | 371/25 |
| 4,514,845 A | 4/1985 | Starr | 371/15 |
| 4,519,078 A | 5/1985 | Komonytsky | 371/25 |
| 4,534,028 A | 8/1985 | Trischler | 371/25 |
| 4,553,090 A | 11/1985 | Hatano et al. | 324/73 AT |
| 4,575,674 A | 3/1986 | Bass et al. | 324/73 R |
| 4,577,318 A | 3/1986 | Whitacre et al. | 371/1 |
| 4,587,609 A | 5/1986 | Boudreau et al. | 395/726 |
| 4,594,711 A | 6/1986 | Thatte | 371/25 |
| 4,597,042 A | 6/1986 | d'Angeac | 364/200 |
| 4,597,080 A | 6/1986 | Thatte et al. | 371/25 |
| 4,598,401 A | 7/1986 | Whelan | 371/25 |
| 4,601,034 A | 7/1986 | Sridhar | 371/25 |
| 4,602,210 A | 7/1986 | Fasang et al. | 324/73 |
| 4,612,499 A | 9/1986 | Andresen et al. | 324/73 R |
| 4,615,029 A | 9/1986 | Hu et al. | 370/89 |
| 4,618,956 A | 10/1986 | Horst | 371/68 |
| 4,621,363 A | 11/1986 | Blum | 371/25 |
| 4,627,018 A | 12/1986 | Trost et al. | 395/476 |
| 4,628,511 A | 12/1986 | Stitzlein et al. | 371/22 |
| 4,635,193 A | 1/1987 | Moyer et al. | 364/200 |
| 4,635,261 A | 1/1987 | Anderson et al. | 371/25 |
| 4,638,313 A | 1/1987 | Sherwood et al. | 340/825.52 |
| 4,642,561 A | 2/1987 | Groves et al. | 324/73 R |
| 4,646,298 A | 2/1987 | Laws et al. | 371/16 |
| 4,646,299 A | 2/1987 | Schinabeck et al. | 371/20 |
| 4,651,088 A | 3/1987 | Sawada | 324/73 R |
| 4,669,061 A | 5/1987 | Bhavsar | 365/154 |
| 4,672,307 A | 6/1987 | Breuer et al. | 324/73 R |
| 4,674,089 A | 6/1987 | Poret et al. | 371/25 |
| 4,679,192 A | 7/1987 | Vanbrabant | 340/825.52 |
| 4,680,539 A | 7/1987 | Tsai | 324/73 |
| 4,680,733 A | 7/1987 | Duforestel et al. | 364/900 |
| 4,683,569 A | 7/1987 | Rubin | 371/25 |
| 4,687,988 A | 8/1987 | Eichelberger et al. | 324/73 AT |
| 4,694,293 A | 9/1987 | Sugiyama et al. | 340/825.68 |
| 4,698,588 A | 10/1987 | Hwang et al. | 324/73 R |
| 4,701,916 A | 10/1987 | Naven et al. | 371/15 |
| 4,701,920 A | 10/1987 | Resnick et al. | 371/25 |
| 4,701,921 A | 10/1987 | Powell et al. | 371/25 |
| 4,710,931 A | 12/1987 | Bellay et al. | 371/25 |
| 4,710,932 A | 12/1987 | Hiroshi | 371/25 |
| 4,710,933 A | 12/1987 | Powell et al. | 371/25 |
| 4,734,921 A | 3/1988 | Giangano et al. | 377/72 |
| 4,740,970 A | 4/1988 | Burrows et al. | 371/15 |
| 4,743,841 A | 5/1988 | Takeuchi | 324/73 R |
| 4,745,355 A | 5/1988 | Eichelberger et al. | 324/73 R |
| 4,752,929 A | 6/1988 | Kantz et al. | 371/21 |
| 4,759,019 A | 7/1988 | Bentley et al. | 371/3 |
| 4,763,066 A | 8/1988 | Yeung et al. | 324/73 R |
| 4,764,926 A | 8/1988 | Knight et al. | 371/25 |
| 4,777,616 A | 10/1988 | Moore et al. | 364/900 |
| 4,783,785 A | 11/1988 | Hanta | 371/25 |
| 4,788,683 A | 11/1988 | Hester et al. | 371/20 |
| 4,791,358 A | 12/1988 | Sauerwald et al. | 324/73 R |
| 4,799,004 A | 1/1989 | Mori | 324/73 R |
| 4,799,052 A | 1/1989 | Near et al. | 340/825.52 |
| 4,800,418 A | 1/1989 | Natsui | 357/68 |
| 4,801,870 A | 1/1989 | Eichelberger et al. | 324/73 R |
| 4,802,163 A | 1/1989 | Hirabayashi | 371/15 |
| 4,808,844 A | 2/1989 | Ozaki et al. | 307/243 |
| 4,811,299 A | 3/1989 | Miyazawa et al. | 365/201 |
| 4,812,678 A | 3/1989 | Abe | 307/443 |
| 4,817,093 A | 3/1989 | Jacobs et al. | 371/25 |
| 4,819,234 A | 4/1989 | Huber | 371/19 |
| 4,821,269 A | 4/1989 | Jackson et al. | 371/16 |
| 4,825,439 A | 4/1989 | Sakashita et al. | 371/15 |
| 4,833,395 A | 5/1989 | Sasaki et al. | 324/73 R |
| 4,833,676 A | 5/1989 | Koo | 371/15 |
| 4,855,954 A | 8/1989 | Turner et al. | 365/185 |
| 4,857,835 A | 8/1989 | Whetsel | 324/73 |
| 4,860,288 A | 8/1989 | Teske et al. | 371/1 |
| 4,860,290 A | 8/1989 | Daniels et al. | 371/25 |
| 4,862,071 A | 8/1989 | Sato et al. | 324/73 R |
| 4,862,072 A | 8/1989 | Harris et al. | 324/73 R |
| 4,864,570 A | 9/1989 | Savaglio et al. | 371/22.4 |
| 4,864,579 A | 9/1989 | Kishida et al. | 371/22.3 |
| 4,866,508 A | 9/1989 | Eichelberger et al. | 357/74 |
| 4,870,345 A | 9/1989 | Tomioka et al. | 371/22.3 |
| 4,872,169 A | 10/1989 | Whetsel | 371/22.3 |
| 4,875,003 A | 10/1989 | Burke | 324/73 R |
| 4,878,168 A | 10/1989 | Johnson et al. | 364/200 |
| 4,879,717 A | 11/1989 | Sauerwald et al. | 371/22.3 |
| 4,887,262 A | 12/1989 | van Veldhuizen | 370/85.1 |
| 4,887,267 A | 12/1989 | Kanuma | 371/22.3 |
| 4,893,072 A | 1/1990 | Matsumoto | 371/223 |
| 4,894,830 A | 1/1990 | Kawai | 371/22.3 |
| 4,896,262 A | 1/1990 | Wayama et al. | 364/200 |
| 4,897,842 A | 1/1990 | Herz et al. | 371/22.4 |
| 4,899,273 A | 2/1990 | Omoda et al. | 364/200 |
| 4,903,266 A | 2/1990 | Hack | 371/21.2 |
| 4,907,230 A | 3/1990 | Heller et al. | 371/22.1 |
| 4,910,735 A | 3/1990 | Yamashita | 371/22.4 |
| 4,912,633 A | 3/1990 | Schweizer et al. | 364/200 |
| 4,912,709 A | 3/1990 | Teske et al. | 371/22.1 |
| 4,918,379 A | 4/1990 | Jongepier | 324/73.1 |
| 4,924,468 A | 5/1990 | Horak et al. | 371/22.1 |
| 4,926,425 A | 5/1990 | Hedtke et al. | 371/22.6 |
| 4,929,889 A | 5/1990 | Seiler et al. | 371/22.3 |
| 4,930,216 A | 6/1990 | Nelson | 29/854 |
| 4,931,722 A | 6/1990 | Stoica | 371/22.5 |
| 4,931,723 A | 6/1990 | Jeffrey et al. | 371/22.3 |
| 4,935,868 A | 6/1990 | DuLac | 364/200 |
| 4,937,826 A | 6/1990 | Gheewala et al. | 371/22.1 |
| 4,943,966 A | 7/1990 | Giunta et al. | 371/11.1 |
| 4,945,536 A | 7/1990 | Hancu | 371/22.3 |
| 4,947,106 A | 8/1990 | Chism | 324/73.1 |
| 4,947,357 A | 8/1990 | Stewart et al. | 371/22.3 |
| 4,956,602 A | 9/1990 | Parrish | 324/158 R |
| 4,961,053 A | 10/1990 | Krug | 324/158 R |
| 4,969,121 A | 11/1990 | Chan et al. | 364/900 |
| 4,974,192 A | 11/1990 | Face et al. | 364/900 |
| 4,974,226 A | 11/1990 | Fujimori et al. | 371/22.3 |

| | | | | | |
|---|---|---|---|---|---|
| 4,989,209 A | 1/1991 | Littlebury et al. ......... 371/22.1 | 5,329,471 A | 7/1994 | Swoboda et al. ........... 364/578 |
| 4,992,985 A | 2/1991 | Miyazawa et al. .......... 365/201 | 5,334,857 A | 8/1994 | Mennitt et al. ............... 257/48 |
| 5,001,713 A | 3/1991 | Whetsel ..................... 371/22.3 | 5,343,478 A | 8/1994 | James et al. ............... 371/22.3 |
| 5,008,618 A | 4/1991 | Van Der Star .......... 324/158 R | 5,353,308 A | 10/1994 | Whetsel ..................... 371/22.3 |
| 5,008,885 A | 4/1991 | Huang et al. ................. 371/3 | 5,355,369 A | 10/1994 | Greenberger et al. ...... 371/22.3 |
| 5,012,185 A | 4/1991 | Ohfuji .................... 324/158 R | 5,366,906 A | 11/1994 | Wojnarowski et al. ......... 437/8 |
| 5,014,186 A | 5/1991 | Chisholm ................... 395/850 | 5,371,390 A | 12/1994 | Mohsen ...................... 257/209 |
| 5,023,872 A | 6/1991 | Annamalai ................. 371/5.1 | 5,377,198 A | 12/1994 | Simpson et al. ........... 371/22.3 |
| 5,042,005 A | 8/1991 | Miller et al. ................ 364/900 | 5,388,216 A | 2/1995 | Oh ............................. 395/849 |
| 5,048,021 A | 9/1991 | Jarwala et al. ............. 371/22.3 | 5,389,556 A | 2/1995 | Rostoker et al. ............... 437/8 |
| 5,051,996 A | 9/1991 | Bergeson et al. .......... 371/22.4 | 5,389,873 A | 2/1995 | Ishii et al. ............... 324/158.1 |
| 5,053,949 A | 10/1991 | Allison et al. .............. 364/200 | 5,390,131 A | 2/1995 | Rohrbaugh et al. ......... 364/490 |
| 5,054,024 A | 10/1991 | Whetsel ..................... 371/22.3 | 5,391,984 A | 2/1995 | Worley .................... 324/158.1 |
| 5,056,093 A | 10/1991 | Whetsel ..................... 371/22.3 | 5,396,170 A | 3/1995 | D'Souza et al. .......... 324/158.1 |
| 5,056,094 A | 10/1991 | Whetsel ..................... 371/25.1 | 5,399,505 A | 3/1995 | Dasse et al. ................... 437/8 |
| 5,070,296 A | 12/1991 | Priebe ........................ 324/73.1 | 5,420,874 A | 5/1995 | Kromer ...................... 371/47.1 |
| 5,070,297 A | 12/1991 | Kwon et al. ............. 324/158 P | 5,424,651 A | 6/1995 | Green et al. ................ 324/754 |
| 5,077,740 A | 12/1991 | Kanuma .................... 371/22.3 | 5,426,650 A | 6/1995 | Ganapathy et al. ........ 371/22.3 |
| 5,084,814 A | 1/1992 | Vaglica et al. .............. 395/325 | 5,428,622 A | 6/1995 | Kuban et al. ............... 371/22.3 |
| 5,084,874 A | 1/1992 | Whetsel ..................... 371/22.3 | 5,430,735 A | 7/1995 | Sauerwald et al. ......... 371/22.3 |
| 5,090,015 A | 2/1992 | Dabbish et al. ............ 371/22.5 | 5,434,804 A | 7/1995 | Bock et al. .................. 364/579 |
| 5,090,035 A | 2/1992 | Murase ......................... 377/72 | 5,442,282 A | 8/1995 | Rostoker et al. .......... 324/158.1 |
| 5,107,148 A | 4/1992 | Millman .................... 307/473 | 5,446,395 A | 8/1995 | Goto .......................... 324/763 |
| 5,107,489 A | 4/1992 | Brown et al. .............. 370/58.2 | 5,448,576 A | 9/1995 | Russell ...................... 371/22.3 |
| 5,109,190 A | 4/1992 | Sakashita et al. ....... 324/158 R | 5,450,415 A | 9/1995 | Kamada ..................... 371/22.3 |
| 5,109,383 A | 4/1992 | Chujo ........................ 371/22.3 | 5,453,992 A | 9/1995 | Whetsel ..................... 371/22.3 |
| 5,115,191 A | 5/1992 | Yoshimori .............. 324/158 R | 5,457,400 A | 10/1995 | Ahmad et al. ............... 324/763 |
| 5,115,435 A | 5/1992 | Langford, II et al. ...... 371/22.1 | 5,469,473 A | 11/1995 | McClear et al. ............. 375/219 |
| 5,126,286 A | 6/1992 | Chance ....................... 437/203 | 5,471,481 A | 11/1995 | Okumoto et al. ........... 371/22.3 |
| 5,128,664 A | 7/1992 | Bishop .................. 340/825.52 | 5,481,734 A | 1/1996 | Yoshida ...................... 395/775 |
| 5,130,988 A | 7/1992 | Wilcox et al. ............. 371/22.3 | 5,483,518 A | 1/1996 | Whetsel ......................... 370/13 |
| 5,132,635 A | 7/1992 | Kennedy ................... 371/22.3 | 5,488,614 A | 1/1996 | Shima ........................ 371/22.3 |
| 5,133,062 A | 7/1992 | Joshi et al. ................. 395/500 | 5,488,728 A | 1/1996 | Dreyer ....................... 395/726 |
| 5,134,314 A | 7/1992 | Wehrmacher ............... 307/443 | 5,489,538 A | 2/1996 | Rostoker et al. ............... 437/8 |
| 5,150,044 A | 9/1992 | Hashizume et al. .... 324/158 R | 5,490,151 A | 2/1996 | Feger et al. ................ 371/22.3 |
| 5,150,047 A | 9/1992 | Saito et al. ............. 324/158 R | 5,491,666 A | 2/1996 | Sturges ....................... 365/201 |
| 5,155,432 A | 10/1992 | Mahoney ................ 324/158 R | 5,491,699 A | 2/1996 | Scheuermann et al. .... 371/22.1 |
| 5,159,465 A | 10/1992 | Maemura et al. ............. 326/73 | 5,526,310 A | 6/1996 | Dondale ..................... 365/196 |
| 5,161,160 A | 11/1992 | Yaguchi et al. ............ 371/22.3 | 5,526,365 A | 6/1996 | Whetsel ..................... 371/22.3 |
| 5,165,022 A | 11/1992 | Erhard et al. ............... 395/275 | 5,532,174 A | 7/1996 | Corrigan ........................ 437/8 |
| 5,167,020 A | 11/1992 | Kahn et al. ................. 395/250 | 5,534,786 A | 7/1996 | Kaneko et al. .............. 324/760 |
| 5,170,398 A | 12/1992 | Fujieda et al. ................. 371/27 | 5,541,935 A | 7/1996 | Waterson .................... 371/22.5 |
| 5,172,377 A | 12/1992 | Robinson et al. .......... 371/22.3 | 5,544,174 A | 8/1996 | Abend ........................ 371/22.3 |
| 5,173,906 A | 12/1992 | Dreibelbis et al. ......... 371/22.5 | 5,548,781 A | 8/1996 | Huang ........................ 395/831 |
| 5,175,447 A | 12/1992 | Kawasaki et al. ........... 307/480 | 5,550,843 A | 8/1996 | Yee ............................ 371/22.3 |
| 5,187,795 A | 2/1993 | Balmforth et al. .......... 395/800 | 5,557,573 A | 9/1996 | McClure .................... 365/201 |
| 5,191,653 A | 3/1993 | Banks et al. ................ 395/275 | 5,568,492 A | 10/1996 | Flint et al. .................. 371/22.1 |
| 5,202,625 A | 4/1993 | Farwell ................... 324/158 R | 5,576,980 A | 11/1996 | Whetsel ...................... 364/579 |
| 5,206,545 A | 4/1993 | Huang ........................ 307/443 | 5,590,275 A | 12/1996 | Van Berkel et al. ..... 395/183.06 |
| 5,210,759 A | 5/1993 | DeWitt et al. .............. 371/22.3 | 5,592,493 A | 1/1997 | Crouch et al. .............. 371/22.3 |
| 5,214,760 A | 5/1993 | Hammond et al. ......... 395/425 | 5,608,335 A | 3/1997 | Tailliet ....................... 324/763 |
| 5,214,774 A | 5/1993 | Welsch et al. .............. 455/11.1 | 5,608,736 A | 3/1997 | Bradford et al. ............ 371/22.3 |
| 5,218,702 A | 6/1993 | Kirtland ..................... 395/298 | 5,610,530 A | 3/1997 | Whetsel ...................... 324/763 |
| 5,241,265 A | 8/1993 | McDonnell et al. .... 324/158 R | 5,610,826 A | 3/1997 | Whetsel ...................... 364/487 |
| 5,241,266 A | 8/1993 | Ahmad et al. .......... 324/158 R | 5,619,462 A | 4/1997 | McClure .................... 365/201 |
| 5,252,917 A | 10/1993 | Kadowaki ............... 324/158 R | 5,623,500 A | 4/1997 | Whetsel ..................... 371/22.1 |
| 5,254,942 A | 10/1993 | D'Souza et al. ........ 324/158 R | 5,627,839 A | 5/1997 | Whetsel ..................... 371/22.3 |
| 5,258,985 A | 11/1993 | Spence et al. .............. 371/22.4 | 5,640,404 A | 6/1997 | Satish ........................ 371/22.3 |
| 5,260,949 A | 11/1993 | Hashizume et al. ........ 371/22.3 | 5,648,661 A | 7/1997 | Rostoker et al. ............... 257/48 |
| 5,276,807 A | 1/1994 | Kodoma et al. ............ 395/309 | 5,659,257 A | 8/1997 | Lu et al. ..................... 324/763 |
| 5,278,494 A | 1/1994 | Obigane .................. 324/158 F | 5,659,773 A | 8/1997 | Huynh et al. ............... 395/821 |
| 5,279,975 A | 1/1994 | Devereaux et al. ............ 437/8 | 5,677,915 A | 10/1997 | Whetsel ..................... 371/22.3 |
| 5,286,656 A | 2/1994 | Keown et al. .................. 437/7 | 5,685,004 A | 11/1997 | Bruce et al. ................ 395/800 |
| 5,291,025 A | 3/1994 | Smith ......................... 250/561 | 5,687,179 A | 11/1997 | Whetsel ..................... 371/22.3 |
| 5,297,277 A | 3/1994 | Dein et al. .................. 395/575 | 5,701,307 A | 12/1997 | Whetsel ..................... 371/22.3 |
| 5,303,148 A | 4/1994 | Mattson et al. ......... 364/413.01 | 5,706,235 A | 1/1998 | Roohparvar et al. ........ 365/201 |
| 5,313,158 A | 5/1994 | Joosten et al. .......... 324/158 R | 5,710,779 A | 1/1998 | Whetsel ..................... 371/22.3 |
| 5,315,241 A | 5/1994 | Ewers .................... 324/158 R | 5,715,171 A | 2/1998 | Mori et al. .................. 364/490 |
| 5,317,205 A | 5/1994 | Sato ........................... 307/443 | 5,715,254 A | 2/1998 | Whetsel ..................... 371/22.3 |
| 5,319,754 A | 6/1994 | Meinecke et al. .......... 395/325 | 5,715,255 A | 2/1998 | Whetsel ..................... 371/22.3 |
| 5,321,322 A | 6/1994 | Verheyen et al. ......... 307/465.1 | 5,719,876 A | 2/1998 | Warren ...................... 371/22.3 |

| | | | |
|---|---|---|---|
| 5,719,878 A | 2/1998 | Yu et al. | 371/22.3 |
| 5,744,949 A | 4/1998 | Whetsel | 324/158.1 |
| 5,760,643 A | 6/1998 | Whetsel | |
| 5,802,270 A | 9/1998 | Ko et al. | 395/183.03 |
| 5,805,792 A | 9/1998 | Swoboda et al. | 395/183.04 |
| 5,825,785 A | 10/1998 | Barry et al. | 371/22.4 |
| 5,828,825 A | 10/1998 | Eskandari et al. | 395/183.03 |
| 5,841,670 A | 11/1998 | Swoboda | 364/578 |
| 5,841,791 A | 11/1998 | Hashizume | 371/22.3 |
| 5,847,561 A | 12/1998 | Whetsel | 324/158.1 |
| 5,862,152 A | 1/1999 | Handly et al. | 371/22.32 |
| 5,872,908 A | 2/1999 | Whetsel | 395/183.06 |
| 5,883,524 A | 3/1999 | Whetsel | 326/16 |
| 5,884,023 A | 3/1999 | Swoboda et al. | 395/183.06 |
| 5,887,004 A | 3/1999 | Walther | 371/22.31 |
| 5,905,738 A | 5/1999 | Whetsel | 371/22.4 |
| 5,907,562 A | 5/1999 | Wrape et al. | 371/22.31 |
| 5,958,072 A | 9/1999 | Jacobs et al. | 714/30 |
| 5,968,191 A | 10/1999 | Thatcher et al. | 714/723 |
| 5,968,192 A | 10/1999 | Kornachuk et al. | 714/724 |
| 6,000,051 A | 12/1999 | Nadeau-Dostie et al. | 714/727 |
| 6,028,983 A | 2/2000 | Jaber | 395/183.06 |
| 6,037,794 A | 3/2000 | Yamamoto et al. | 324/760 |
| 6,073,254 A | 6/2000 | Whetsel | 714/30 |
| 6,115,763 A | 9/2000 | Douskey et al. | 710/72 |
| 6,158,032 A * | 12/2000 | Currier et al. | 714/726 |
| 6,158,035 A | 12/2000 | Whetsel et al. | 714/731 |
| 6,199,182 B1 | 3/2001 | Whetsel | 714/724 |
| 6,223,315 B1 | 4/2001 | Whetsel | 714/727 |
| 6,242,269 B1 | 6/2001 | Whetsel | 438/11 |
| 6,260,165 B1 | 7/2001 | Whetsel | 714/727 |
| 6,286,121 B1 | 9/2001 | Osawa et al. | 714/738 |
| 6,311,302 B1 | 10/2001 | Cassetti et al. | 714/727 |
| 6,316,959 B1 * | 11/2001 | Onodera | 326/46 |
| 6,324,614 B1 | 11/2001 | Whetsel | 710/130 |
| 6,324,662 B1 | 11/2001 | Haroun et al. | 714/724 |
| 6,327,685 B1 * | 12/2001 | Koprowski et al. | 714/733 |
| 6,343,365 B1 | 1/2002 | Matsuzawa et al. | 714/726 |
| 6,446,230 B1 | 9/2002 | Chung | 714/726 |
| 6,457,148 B1 | 9/2002 | Yoshiba | 714/718 |
| 6,594,802 B1 * | 7/2003 | Ricchetti et al. | 716/4 |

FOREIGN PATENT DOCUMENTS

| | | | |
|---|---|---|---|
| EP | 0190494 | 8/1986 | G01R/31/28 |
| EP | 0195164 | 9/1986 | G01R/31/28 |
| EP | 0273821 | 7/1988 | G01R/31/28 |
| EP | 0310152 | 4/1989 | G01R/31/28 |
| EP | 0315475 A2 | 10/1989 | G01R/31/28 |
| EP | 0518550 A2 | 12/1992 | |
| EP | 0522413 A2 | 1/1993 | |
| EP | 0604032 A2 | 6/1994 | |
| GB | 2220272 A | 1/1990 | G01R/31/28 |
| GB | 2266965 A | 11/1993 | G01R/31/28 |
| JP | 57-094857 A | 6/1982 | |
| JP | 57-209546 | 12/1982 | G06F/11/20 |
| JP | 58-155599 | 9/1983 | |
| JP | 58-191021 A | 11/1983 | |
| JP | 59-210382 | 11/1984 | G01R/31/28 |
| JP | 60-140834 A | 7/1985 | H01L/21/66 |
| JP | 60-252958 | 12/1985 | G06F/11/22 |
| JP | 60-262073 | 12/1985 | G01R/31/28 |
| JP | 62-031447 A | 2/1987 | |
| JP | 62-228177 | 10/1987 | G01R/31/28 |
| JP | 62-280663 | 12/1987 | G01R/31/28 |
| JP | 63-073169 | 4/1988 | G01R/31/28 |
| JP | 63-188783 A | 8/1988 | G01R/31/28 |
| JP | 63-213014 A | 9/1988 | |
| JP | 63-310046 A | 12/1988 | |
| JP | 64-006572 | 1/1989 | G01R/31/28 |
| JP | 01-038674 A | 2/1989 | G01R/31/28 |
| JP | 01-043773 | 2/1989 | G01R/31/28 |
| JP | 01-068167 A | 3/1989 | H04M/3/22 |
| JP | 01-079673 A | 3/1989 | G01R/31/28 |
| JP | 01-110274 | 4/1989 | G01R/31/28 |
| JP | 01-170873 | 7/1989 | G01R/31/28 |
| JP | 02-016642 A | 1/1990 | G06F/11/22 |
| JP | 02-062984 | 3/1990 | G01R/31/28 |
| JP | 02-052165 | 4/1990 | G01R/13/28 |
| JP | 5-142298 | 6/1993 | G01R/31/28 |

OTHER PUBLICATIONS

Avra, LaNae, "A VHSIC ETM–BUS Compatible Test and Maintenance Interface", 1987 International Test Conference, Sep. 1–3, 1987, Paper 41.2, pp. 964–971.

Bhavsar, D., "An Architecture for Extending the IEEE Standard 1149.1 Test Access Port to System Backplanes", International Test Conference 1991, pp. 768–776, Jan. 1, 1991.

Bhavsar, D., "Chapter 17. Designs that Help Test Interconnect Shorts", IEEE, 1990, pp. 183–189, Jan. 1, 1990.

Bhavsar, D., et al., "Self–Testing by Polynomial Division", Digest of Papers, International Test Conference, 1981, pp. 208–216, Jan. 1, 1981.

Blair, Jack D.; et al., "A 16–Mbit/s Adapter Chip for the IBM Token–Ring Local Area Network", IEEE Journal of Solid–State Circuits, vol. 24, No. 6, Dec. 1, 1989, pp. 1647–1654.

Breuer, Melvin A.; Lien, Jung–Cheun, "A Test and Maintenance Controller for a Module Containing Testable Chips", 1988 International Test Conference, Sep. 12–14, 1988, Paper 27.1, pp. 502–513.

Bruce, W. C., et al., "Implementing 1149.1 on CMOS Processors", IEEE International Test Conference 1992, Paper BP–91, pp. 999–1006, Jan. 1, 1992.

Carbine, Adrian and Feltham, Derek, "Pentium Pro Processor Design for Test and Debug," International Test Conference 1997, Nov. 1–6, 1997, pp. 294–303, IEEE Computer Society.

Colwell, Robert P. and Steck, Randy L., "TP 10.4: A 0.6um BiCMOS Processor with Dynamic Execution," 1995 IEEE International Solid–State Circuits Conference, Feb. 15–17, 1995, pp. 176–177.

Dervisoglu, Bulent I., "Using Scan Technology for Debug and Diagnostics in a Workstation Environment", 1988 International Test Conference, Sep. 12–14, 1988, Paper 45.2, pp. 976–986.

Dervisoglu, Bulent, "IEEE P1149.2 Description and Status Report", IEEE Design and Test of Computers, Sep. 1, 1992, pp. 79–81

Dervisoglu, Bulent, et al., "Shared I/O–Cell Structures: A Framework for Extending the IEEE 1149.1 Boundary–Scan Standard", Int'l Test Conference, Oct. 19, 1998, pp. 908–989.

El–ziq. et al., "A Mixed–Mode Built–In Self–Test Technique Using Scan Path and Signature Analysis", International Test Conference, Oct. 18–20, 1983, pp. 269–274.

ETM–Bus Specification, VHSIC Phase 2 Interoperability Standards, Dec. 31, 1985, Version 1.0.

George, David, "Use a reprogramable approach to boundary scan for FPGAs", EDN, Electrical Design News, vol. 38, No. 16, Aug. 5, 1993, pp. 97–104.

Gerstendorfer, S. et al. "Minimized Power Consumption for Scan–Based BIST", Proceedings International Test Conference, Sep. 28–30, 1999 (IEEE Cat. No. 99CH37034) pp. 77–84.

Gott, Robert A., "Embedded Systems: Debugging Embedded Software," pp. 71–73, 76, 78, Computer Design, Feb. 1, 1998.

Haedtke, et al., "Multilevel Self–test for the Factory and Field", Proceedings, Annual Relaibility and Maintainability Symposium, Jan. 1, 1987.

Hahn, et al., "VLSI Testing By On–Chip Error Detection", IBM Technical Disclosure Bulletin, vol. 25, No. 2, Jul. 1, 1982.

Heatherington, G. et al., "Logic BIST for Large Industrial Designs: Real Issues and Case Studies," Proceedings International Test Conference, Sep. 28, 1999, IEEE vol. CONF. 30, pp. 358–367.

Hudson, et al., "Integrating BIST And Boundary–Scan On A Board", Proceedings of the National Communications Forum, Sep. 30, 1988, pp. 1796–1800.

Hudson, et al., "Parallel Self–test With Pseudo–Random Test Patterns", International Test Conference, Sep. 1–3, 1987, pp. 954–963.

Hunter, C., et al., "Design and Implementation of the 'G2' PowerPC™ 603e™ Embedded Microprocessor Core", IEEE International Test Conference Proceedings, Oct. 18–23, 1998.

IBM Technical Disclosure Bulletin, "Bidirectional Double Latch", vol. 28, No. 1, Jun. 1, 1985

IBM Technical Disclosure Bulletin, "Self–Contained IBM Performance Monitor for a Personal Computer", Dec. 1, 1988, vol. 3, No. 7, pp. 376–377.

IBM Technical Disclosure Bulletin, "Test Bus Architecture", vol. 32, No. 3A, Aug. 1, 1989, pp. 21–27.

IEEE P1149.2—D2.5, "Extended Digital Serial Subset", Unapproved Draft Published for Comment Only, Aug. 30, 1994, pp. 1/37.

Intel, "80386 Programmer's Reference Manual 1986", Chapter 12: Debugging, pp. 12–1–12–9, Jan. 18, 1988.

Intel, "Intel386™ DX Microprocessor Data Sheet," Section 2.11: Testability, Jan. 1, 1988.

Intel, "Microprocessor and Peripheral Handbook", 80386 Preliminary, Section 2.11: Testability, Jan. 1, 1988.

Jarwala, Mahuri, "A Framework for Design for Testability of Mixed Analog/Digital Circuits", IEEE Jan. 1, 1991 Custom Integrated Circuits Conference, pp. 13.5.1–4.

Joint Test Action Group, Technical Sub–Committee, "A Standard Boundary Scan Architecture", Jan. 1, 1988.

Jungert, H., et al., "JTAG: Standard Testing of Complex Systems. Part 3: Bus Drivers and Latches with JTAG Test Ports", Elektronik, Messen und Testen, No. 14, Jul. 7, 1989, pp. 96–103, with translation.

Kuban, John R. and Bruce, William C, "Self–Testing the Motorola MC6804P2," IEEE Design & Test, May, 1984, earlier version in International Test Conference Proceedings, Oct. 1, 1983.

Laurent, "An Example of Test Strategy for Computer Implemented with VLSI Circuits", IEEE International Conference on computer Design: VLSI in Computers, Oct. 7–10, 1985, pp. 679–682.

Lee, Nai–Chi, "A Hierarchical Analog Test Bus Framework for Testing Mixed–Signal Integrated Circuits and Printed circuit Boards", Journal of Electronic Testing: Theory and Applications, 4(1993), Nov. 1, 1993, No. 4, Dordrecht, NE, pp. 361–368.

Lien, Jung–Cheun; Breuer, Melvin A., "A Universal Test and Maintenance Controller for Modules and Boards", IEEE Transactions on Industrial Electonics, vol. 36, No. 2, May 1, 1989, pp. 231–240.

Lofstrom, Keith, "A Demonstration IC for the P1149.4 Mixed–Signal Test Standard", IEEE International Test Conference Jan. 1, 1996, Paper 4.2, pp. 92–98.

Loftstrom, Keith, "Early Capture for Boundary Scan Timing Measurements", International Test Conference 1996, Oct. 20–25, 1996, pp. 417–422.

Maierhofer, J., "Hierarchial Self–Test Concept Based on the JTAG Standard", IEEE International Test Conference Jan. 1, 1990, Paper 5.2, pp. 127–134.

Marinissen, Erik Jan, IEEE P1500 Core Test Standardization, Philips Research Laboratories, Nov. 1, 1997, P1500 Meeting, ITC Test Week, Washington, D.C.

Marlett, et al., "RISP Methodology", Electronic Engineering, Feb. 1, 1989, pp. 45–48.

Maunder, Colin, and Beenker, Frans, "Boundary–Scan: A Framework for Structured Design–for–Test," paper 30.1, International Test Conference 1987 Proceedings, Sep. 1–3, 1987.

Mixed–Signal Working Group, "Standard for a Mixed Signal Test Bus", D11, Mar. 1, 1997, pp. 1–51.

Ohletz, et al., "Overhead in Scan and Self–testing Designs", International Test Conference, 1987, Sep. 1–3, 1987, pp. 460–470.

Ohsawa, et al., "60–ns $–Mbit CMOS DRAM with Built–In self–Test Function", IEEE Journal of Solid–State Circuits, vol. SC–22, No. 5, Oct. 1, 1987, pp. 663–668.

Paraskeva, et al., "New Test Structure for VLSI Self–Test: The Structured Test Register", 8030 Electronic Letters, 21 (1985) Sep. No. 19, Stenenage, Herts, Great Britain, Jul. 26, 1985.

Parker, "The Impact of Boundary Scan on Board Test", IEEE design & Test of Computers, Aug. 1, 1989, pp. 18–30.

Parker, Kenneth, et al., "Structure and Methodology for an Analog Testability Bus", IEEE International Test Conference Jan. 1, 1993, Paper 15.2, pp. 309–322.

Pradhan, M.M., et al., "Circular BIST with Partial Scan," 1988 International Test Conference, Sep. 12–14, 1987, Paper 35.1, pp. 719–727.

Russell, "The JTAG Proposal and Its Impact On Automatic Test", ATE & Instrumentation Conference, Sep. 1, 1988, pp. 289–297.

Sabo, et al., "Genesil Silicon Compilation and Design For Testability", IEEE Custom Integrated Circuits Conference, May 12–15, 1986, pp. 416–420.

Sasidhar, K, Chatterjee, A., Zorian, Y., "Optimal Multiple Chain Relay Testing Scheme for MCMs on Large Area Substrates," Jan. 1, 1996 IEEE International Test Conference, Paper 31.1, pp. 818–827.

Sasidhar, K, Chatterjee, A., Zorian, Y., "Relay Propagation Scheme for Testing of MCMs on Large Area Substrates," Jan. 1, 1996 IEEE 1066–1409/96, pp. 131–135.

Sellers, et al., "Error Detecting Logic for Digital Computers", McGraw–Hill Co., Jan. 1, 1968 pp. 207–211.

Sharp, John, "JTAG Emulation Systems Explore Embedded Cores," pp. 62, Electronic Engineering Times, Jun. 15, 1998.

Sunter, S.K., "Cost/Benefit Analysis of the P1149.4 Mixed–signal Test Bus", IEE Proceedings, Circuits, Devices, Systems, vol. 143, No. 6, Dec. 1, 1996, pp. 393–398.

Sunter, Stephen, "A Low Cost 100 MHz Analog Test Bus", IEEE Jan. 1, 1995, pp. 60–65.

Texas Instruments Data Book, Jan. 1, 1991, "Advanced Logic Bus Interface Logic", pp. 11–3, 11–11, 11–18, 11–19, 11–23, 11–82, 11–83, 11–84, 11–85.

van Riessen, R. P., Kerkhoff, H. G., Kloppenburg, A., "Design and Implementation of a Hierarchical Testable Architecture Using the Boundary Scan Standard", Proceedings, 1st European Test Conference, Paris, France, Apr. 12–14, 1989, pp. 112–118.

Wagner, "Interconnect Testing With Boundary Scan", International Test Conference Proceedings, Sep. 1–3 1987, pp. 52–57.

Wang, et al., "Concurrent Built–In Logic Block Observer (CBILBO)", IEEE International Symposium On Circuits and Systems, May 5–7, 1986, vol. 3, pp. 1054–1057.

Wang, Laung–Terng; Marhoefer, Michael; McCluskey, Edward, J., "A Self–Test and Self–Diagnosis Architecture for Boards Using Boundary Scan", Proceedings 1st European Test Conference, Paris, Apr. 12–14, 1989, pp. 119–126.

Whetsel, Lee, "An IEEE 1149.1 Based Test Access Architecture For ICs With Embedded Cores", International Test Conference 1997. Nov. 1–6, 1997, pp. 69–78.

Whetsel, Lee, "Improved Boundary Scan Design", IEEE International Test Conference 1995 Proceedings, Oct. 21–25, 1995, Paper 36.2, pp. 851–860.

Whetsel, Lee, "A Proposed Standard Test Bus and Boundary Scan Architecture", IEEE International Conference on Computer Design: VLSI in Computers & Processes, Oct. 3–5, 1988, pp. 330–333.

Whetsel, Lee, "A Standard Test Bus and Boundary Scan Architecture," pp. 48–59, Texas Instruments Technical Journal, Jul. 1–Aug. 1988, vol. 5, No. 4.

Whetsel, Lee, "A View of the JTAG Port and Architecture", ATE & Instrumentation Conference West, Jan. 11–14, 1988, pp. 385–401.

Whetsel, Lee, "Addressable Test Ports: An Approach to Testing Embedded Cores," 1999 ITC & TI Test Symposium, Sep. 28–30, 1999.

Whetsel, Lee, "An IEEE 1149.1 Based Logic/Signature Analyzer in a Chip," International Test Conference 1991 Proceedings, Oct. 26–30, 1991.

Whetsel, Lee, "IEE STD. 1149.1—An Introduction", NEPCON, Feb. 1, 1993, 10 pages.

Whetsel, Lee, "JTAG Compatible Devices Simplify Board Level Design For Testability," 8080 Wescon Conference Record 33 (1989) Nov. 1, 1989, pp. 294–299.

Zorian, Yervant; Jarwala, Najmi, "Designing Fault–Tolerant, Testable, VLSI Processors Uasing the IEEE P1149.1 Boundary Scan Architecture", 7th IEEE International Conferenceon Computer Design: VLSI in Computers & Processors, Oct. 2–4, 1989.

* cited by examiner

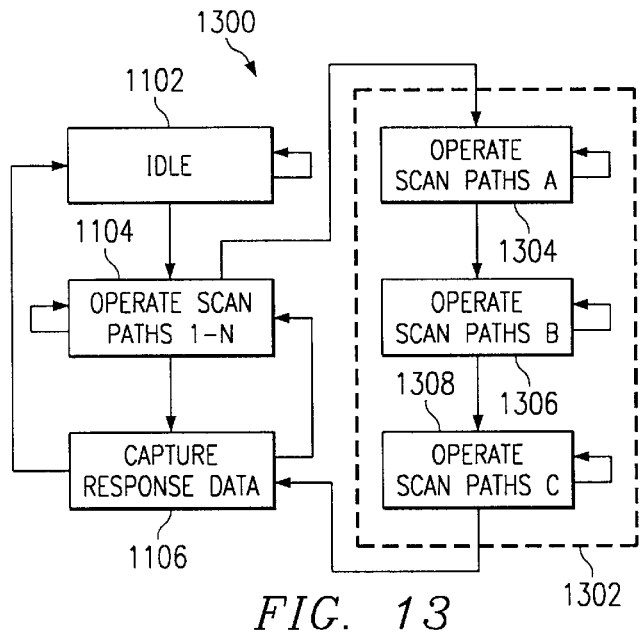
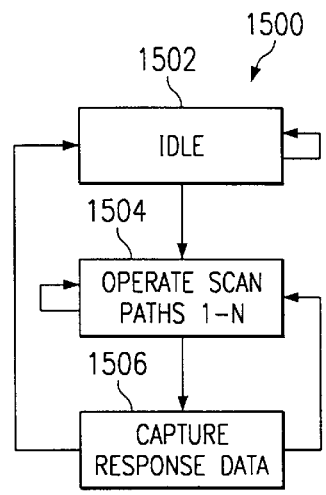
FIG. 13
FIG. 15
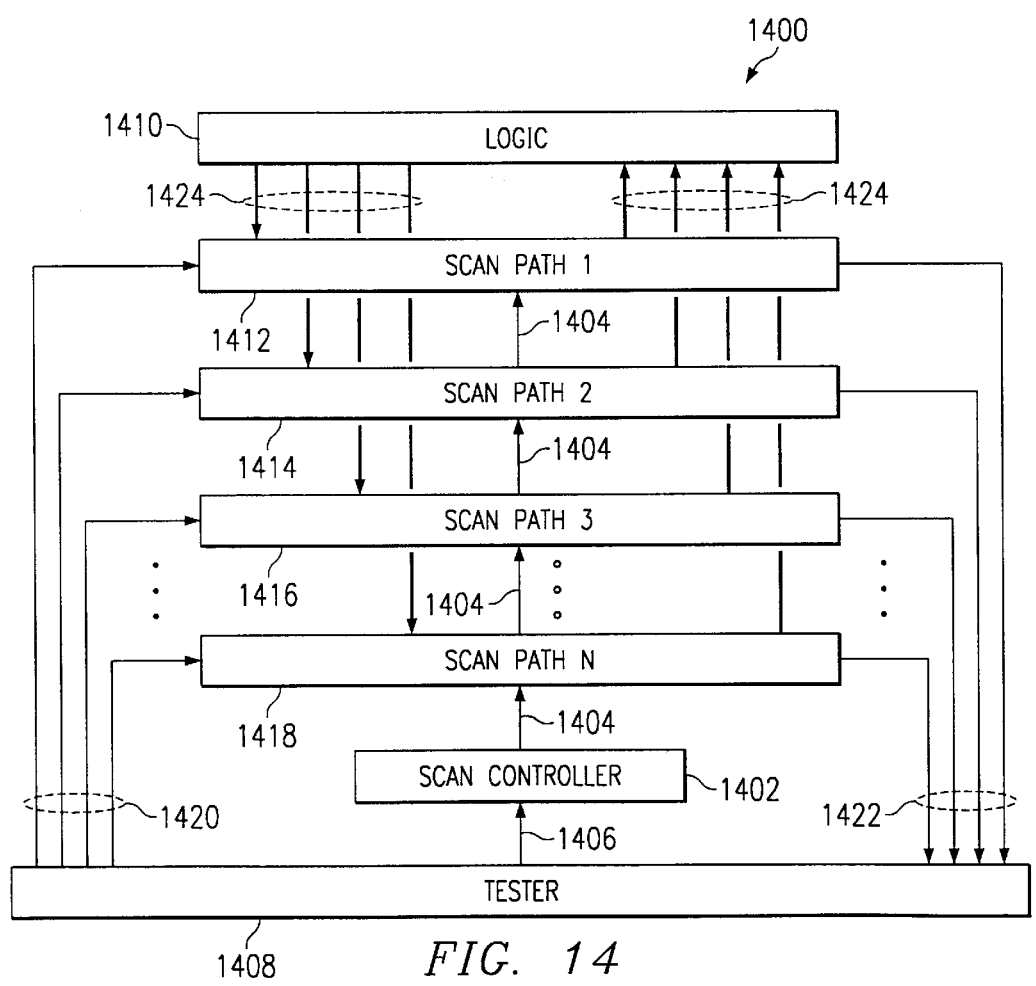
FIG. 14

SCAN CIRCUIT LOW POWER ADAPTER WITH COUNTER

This application claims the benefit of Provisional application No. 60/187,972 filed Mar. 9, 2000.

CROSS-REFERENCE AND INCORPORATION BY REFERENCE OF RELATED APPLICATION

This disclosure relates to and incorporates by reference U.S. Pat. No. 6,519,729, and US Patent Application Publication 2002/0,112,199 A1.

BACKGROUND OF THE INVENTION

1. Field of the Invention

Scan architectures are commonly used to test digital circuitry in integrated circuits. The present invention describes a method of adapting conventional scan architectures into a low power scan architecture. The low power scan architecture maintains the test time of conventional scan architectures, while requiring significantly less operational power than conventional scan architectures. The low power scan architecture is advantageous to IC/die manufacturers since it allows a larger number of circuits (such as DSP or CPU core circuits) embedded in an IC/die to be tested in parallel without consuming too much power within the IC/die. Since the low power scan architecture reduces test power consumption, it is possible to simultaneously test more die on a wafer than previously possible using conventional scan architectures. This allows wafer test times to be reduced which reduces the manufacturing cost of each die on the wafer.

2. Description of the Related Art

FIG. 1 illustrates a conventional scan architecture that a circuit 100 can be configured into during test. In the normal functional configuration, circuit 100 may be a functional circuit within IC, but in test configuration it appears as shown in FIG. 1. Scan architectures can be applied at various circuit levels. For example, the scan architecture of FIG. 1 may represent the testing of a complete IC, or it may represent the testing of an embedded intellectual property core sub-circuit within an IC, such as a DSP or CPU core sub-circuit. The scan architecture includes a scan path circuit 104, logic circuitry to be tested 108, and connection paths 112–120 to a tester 110. Tester 110 operates to: (1) output control to operate scan path 104 via control path 114; (2) output serial test stimulus patterns to scan path 104 via scan input path 118; (3) input serial test response patterns from scan path 104 via scan output path 120; (4) output parallel test stimulus patterns to logic 108 via primary input path 112; and (5) input parallel test response patterns from logic 108 via primary output path 116. Scan path 104 operates, in addition to its scan input and scan output modes to tester 110, to output parallel test stimulus patterns to logic 108 via path 122, and input parallel response patterns from logic 108 via path 124.

Typically tester 110 is interfaced to the scan architecture by probing the die pads at wafer level, or by contacting package pins after the die is assembled into a package. While tester 110 connections to the primary inputs 112 and primary outputs 116 of logic 108 are shown, the primary input and output connections could be achieved by augmentation of scan path 104. For example, scan path 104 could be lengthened to include boundary scan cells located on each primary input and primary output of logic 108. The boundary scan cells would provide primary inputs to and primary outputs from logic 108, via widened stimulus and response busses 122 and 124, respectively. In some instances, logic 108 may be sufficiently tested by scan path 104 such that it is not necessary to provide primary inputs to and outputs from logic 108 via the tester or via the above described augmentation of scan path 104. For example, if the amount of logic 108 circuitry made testable by the use of scan path 104 in combination with the primary inputs and outputs is very small compared to the amount of logic 108 circuitry made testable by the scan path 104 alone, then the primary input and output connections to logic 108 may removed without significantly effecting the test of logic circuitry 108. To simplify the description of the prior art and following description of the present invention, it will be assumed that logic circuit 108 is sufficiently tested using only scan path 104, i.e. the primary inputs 112 and primary outputs 116 are not required. However, it is clear that primary input and output connections to the tester or to an augmented scan path 104, as described above, could be used as well.

FIG. 2 illustrates an example of a conventional scan cell that could be used in scan path 104. (Note: The optional scan cell multiplexer 218 and connection paths 220 and 224, shown in dotted line, will not be discussed at this time, but will be discussed later in regard to FIG. 7.) The scan cell consists of a D-FF 204 and a multiplexer 202. During normal configuration of the circuit 100, multiplexer 202 and D-FF 204 receive control inputs SCANENA 210 and SCANCK 212 to input functional data from logic 108 via path 206 and output functional data via path 216. In the normal configuration, the SCANCK to D-FF 204 is typically a functional clock, and the SCANENA signal is set such that the D-FF always clocks in functional data from logic 108 via path 206. During the test configuration of FIG. 2, multiplexer 202 and D-FF 204 receive control inputs SCANENA 210 and SCANCK 212 to capture test response data from logic 108 via path 206, shift data from scan input path 208 to scan output path 214, and apply test stimulus data to logic 108 via path 216. In the test configuration, the SCANCK to D-FF 204 is the test clock and the SCANENA signal is operated to allow capturing of response data from logic 108 and shifting of data from scan input 208 to scan output 214. During test configuration, SCANENA is controlled by tester 110 via path 114. SCANCK may also be controlled by the tester, or it may be controlled by another source, for example a functional clock source. For the purpose of simplifying the operational description, it will be assumed that the SCANCK is controlled by the tester.

The scan inputs 208 and scan outputs 214 of multiple scan cells are connected to form the serial scan path 104. The stimulus path 216 and response path 206 of multiple scan cells in scan path 104 form the stimulus bussing path 122 and response bussing path 124, respectively, between scan path 104 and logic 108. From this scan cell description, it is seen that the D-FF is shared between being used in the normal functional configuration and the test configuration. During scan operations through scan path 104, the stimulus outputs 216 from each scan cell ripple, since the stimulus 216 path is connected to the scan output path 214. This ripple causes all the inputs to logic 108 to actively change state during scan operations. Rippling the inputs to logic 108 causes power to be consumed by the interconnect and gating capacitance in logic 108.

FIG. 3 illustrates a simplified example of how tester 110 operates, in states 300, the scan architecture during test. Initially the tester will output control on path 114 to place the scan architecture in an idle state 302. Next, the tester outputs control on path 114 to place the scan architecture in an operate scan path state 304. In the operate scan path state, the tester outputs control to cause the scan path to accept stimulus data from the tester via path 118 and to output response data to the tester via path 120. The tester maintains the operate scan path state until the scan path has been filled with stimulus data and emptied of response data. From the operate scan path state, the tester outputs control on path 114 to place the scan architecture in a capture response data state 306. In the capture response data state, the tester outputs control to cause the scan path to load response data from logic 108 via path 124. From the capture response data state 306, the tester outputs control on path 114 to cause the scan architecture to re-enter the operate scan path state 302. The process of entering the operate scan path state 304 to load stimulus into the scan path and empty response from the scan path, and then passing through the capture response state 306 to load new response data from logic 108 repeats until the end of test. At the end of test the tester outputs control to cause the scan architecture to re-enter the idle state 302.

FIG. 4 illustrates a timing example of how tester 110 outputs SCANENA and SCANCK signals to scan path 104 during scan operations. In this example, a high to low transition on SCANENA, at time 406, in combination with SCANCKs occurring during time interval 402, causes stimulus data from the tester to be input to the scan path via path 118 while response data is output from the scan path to the tester via path 120. A low to high transition on SCANENA, at time 408, in combination with a SCANCK at time 404, causes response data from logic 108 to be loaded into the scan path. Time interval 402 relates to state 304 of operating the scan path, and time interval 404 relates to state 306 of capturing a response, in FIG. 3. As seen in the timing and operation diagrams of FIGS. 3 and 4, the time interval sequences 404 (i.e. state 306) and 402 (i.e. state 304) cycle a sufficient number of times during test to input all stimulus to and obtain all response from logic 108.

From the scan architecture described in regard to FIGS. 1, 2, 3, and 4 it is seen that the stimulus 122 outputs ripple the inputs to logic 108 as data shifts through the scan path 104 during scan operations. Rippling the inputs of logic 108 causes simultaneous charging and discharging of capacitances associated with the interconnects and gates of logic 108. For example, each scan cell stimulus output 216 to logic 108 charges and discharges a certain amount of capacitance within logic 108 at a frequency related to the data bits being scanned through the scan cell. While each scan cell stimulus output may only be directly input to a few gates within logic 108, each of the gates in logic 108 have outputs that fanout to inputs of other gates in logic 108, and the outputs of the other gates in logic 108 again fanout to inputs of still further gates, and so on. Thus a transition on the stimulus output of a single scan cell may initiate hundreds of transitions within logic 108 as a result of the above mentioned signal transition fanout. Each of the transitions charge or discharge a portion of the total capacitance with logic 108 and therefore contribute to power consumption within logic 108.

The individual power (Pi) consumed by the rippling of a given scan cell output 216 can be approximated by $CV^2F$, where C is the capacitance being charged or discharged by the scan cell output (i.e. the capacitance of the above mentioned signal transition fanout), V is the switching voltage level, and F is the switching frequency of the scan cell output. The total power (Pt) consumed by simultaneously scanning all the scan cells in scan path 104 is approximately the sum of the individual scan cell powers, i.e. $Pt=Pi_1+Pi_2+\ldots Pi_N$. The total power consumed by circuit 100, when it is configured into the scan architecture of FIG. 1, can exceed the power consumed by circuit 100 when it is configured into its normal functional mode. This can be understood from the fact that, during normal functional mode of circuit 100, not all the D-FFs 204 simultaneously operate, as they do during scan operations occurring during the above described scan test operation. Further if an IC contained multiple circuits 100, the test of the IC may require testing each circuit 100 individually due to the above described test power consumption restriction. This lengthens the test time of the IC, which increases the cost to manufacture the IC.

A first known method of reducing power consumption during test operation is to insert blocking circuitry, such as a gate, into the stimulus paths 216 of each scan cell, such that during scan operations the inputs to logic 108 are blocked from the effect of the scan ripple. The problem with the first method is that it adds an undesirable delay (i.e. the blocking circuit delay) in the stimulus paths 216 between D-FFs 204 and logic 108. This delay can negatively effect the performance of circuit 100 when it is configured into its normal functional mode. A second known method is to reduce the scan clock rate, such that the ripple frequency (F) is reduced. The problem with the second method is that it increases the test time since scan operations are performed at the reduced scan clock rate.

Today, there are a number of test synthesis vendor tools that can synthesize and insert scan architectures into ICs, similar in structure to the scan architecture shown in FIG. 1. The use of such "push-button" scan insertion tools is an attractive alternative to customized scan designs since it is an automated process. As will be described, the present invention provides a method of adapting these synthesized scan architectures such that they may operate in a desired low power mode. The process of adapting scan architectures for low power operation is also easily automated.

The present invention described below provides a method of adapting synthesized scan architectures to achieve a low power mode of operation. The process of adapting scan architectures for low power operation is achieved without the aforementioned problems of; (1) having to insert blocking circuitry in the stimulus paths which adds signal delays, and (2) having to decrease the scan clock rate which increases test time. Furthermore, as will be described in more detail later, the process of adapting scan architectures for low power operation is achieved without having to modify the stimulus and response test patterns which are automatically produced by scan architecture synthesis tools.

BRIEF SUMMARY OF THE INVENTION

The present invention describes a method of adapting conventional scan architectures into a low power scan architecture. The low power scan architecture maintains the test time of conventional scan architectures, while requiring significantly less operational power than conventional scan architectures. The low power scan architecture is advantageous to IC/die manufacturers since it allows a larger number of circuits (such as DSP or CPU core circuits) embedded in an IC/die to be tested in parallel without consuming too much power within the IC/die. Since the low power scan architecture reduces test power consumption, it is possible to simultaneously test more die on a wafer than previously possible using conventional scan architectures. This allows wafer test times to be reduced which reduces the manufacturing cost of each die on the wafer.

Adapting a known scan path into a scan path of the present invention involves reorganizing the known scan path from being a single scan path containing all the scan cells (M), into a scan path having a desired number of selectable separate scan paths.

BRIEF DESCRIPTION OF THE SEVERAL VIEWS OF THE DRAWINGS

FIG. 13 is a flow chart of the operation of the circuit of FIG. 12.

FIG. 14 is a block diagram of another conventional parallel scan path circuit.

FIG. 15 is a flow chart of the operation of the circuit of FIG. 14.

DETAILED DESCRIPTION OF THE INVENTION

Figure 1:
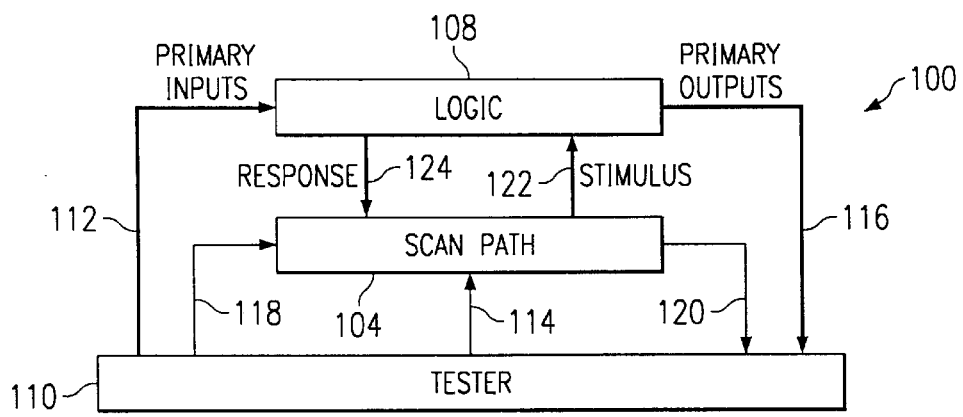
FIG. 1 is a block diagram of a circuit having a single scan path.
Figure 5:
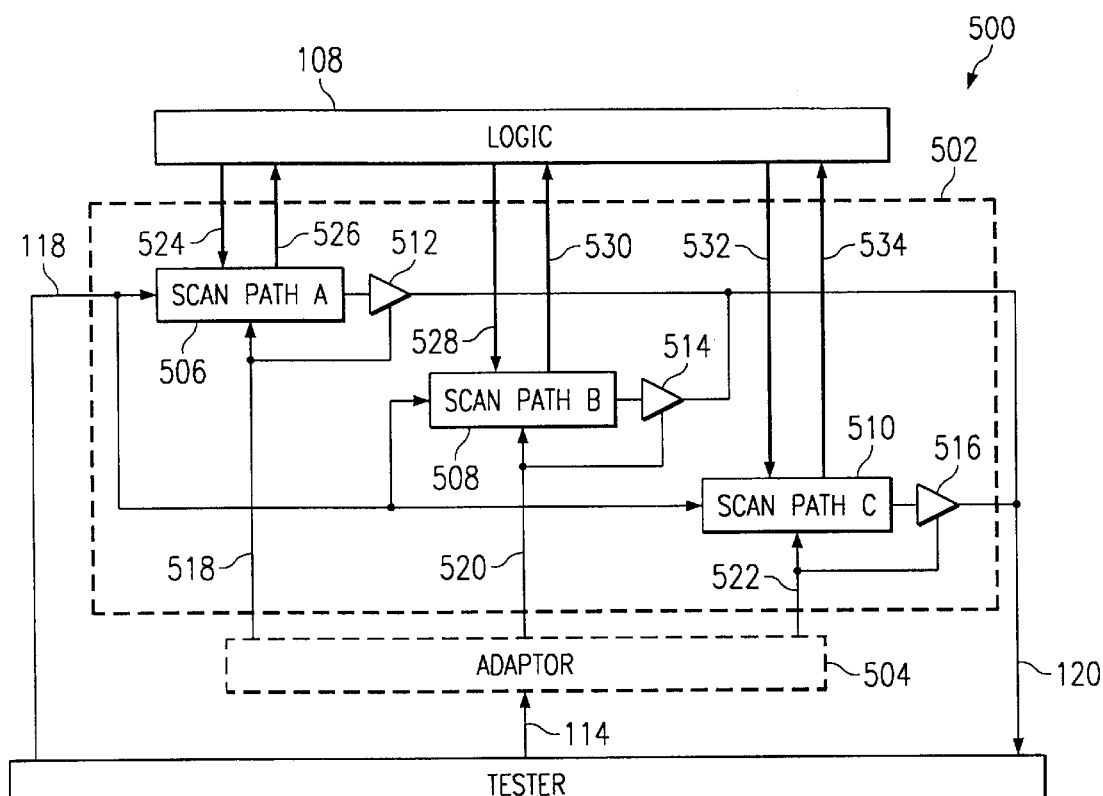
FIG. 5 is a block diagram of a circuit having a scan path arranged according to the present invention.

FIG. 5 illustrates the scan architecture of FIG. 1 after it has been adapted into the low power scan architecture of the present invention. The changes between the FIG. 1 scan architecture and the FIG. 5 low power scan architecture involve modification of scan path 104 into scan path 502, and the insertion of an adaptor circuit 504 in the control path 114 between tester 110 and scan path 502.

Adapting scan path 104 into scan path 502 involves reorganizing scan path 104 from being a single scan path containing all the scan cells (M), into a scan path having a desired number of selectable separate scan paths. In FIG. 5, scan path 502 is shown after having been reorganized into three separate scan paths A 506, B 508, and C 510. It is assumed at this point in the description that the number of scan cells (M) in scan path 104 is divisible by three such that each of the three separate scan paths A, B, and C contains an equal number of scan cells (M/3). The case where scan path 104 contains a number of scan cells (M) which, when divided by the number of desired separate scan paths, does not produce an equal number of scan cells in each separate scan path will be discussed later in regard to FIG. 9.

Scan paths A, B, and C are configured as follows inside scan path 502. The serial input of each scan path A, B, and C is commonly connected to tester 110 via connection path 118. The serial output of scan path A is connected to the input of a 3-state buffer 512, the serial output of scan path B is connected to the input of a 3-state buffer 514, and the serial output of scan path C is connected to the input of a 3-state buffer 516. The outputs of the 3-state buffers 512–516 are commonly connected to tester 110 via connection path 120. Scan paths A, B, and C each output an equal number of parallel stimulus inputs 526, 530, 534 to logic 108, and each input an equal number of parallel response outputs 524, 528, 532 from logic 108. The number of stimulus output signals to logic 108 in FIGS. 1 and 5 is the same. The number of response input signals from logic 108 in FIGS. 1 and 5 is the same. Scan path A and buffer 512 receive control input from adaptor 504 via bus 518, scan path B and buffer 514 receive control input from adaptor 504 via bus 520, and scan path C and buffer 516 receive control input from adaptor 504 via bus 522.

Adaptor 504 is connected to scan paths A, B, C via busses 518–522 and to tester 110 via bus 114. The purpose of the adaptor is to intercept the scan control output 114 from tester 110 and translate it into a sequence of separate scan control outputs 518–522 to scan paths A, B, and C, respectively. Each of the separate scan control outputs 518–522 are used to operate one of the scan paths A, B, and C.

Figure 3:
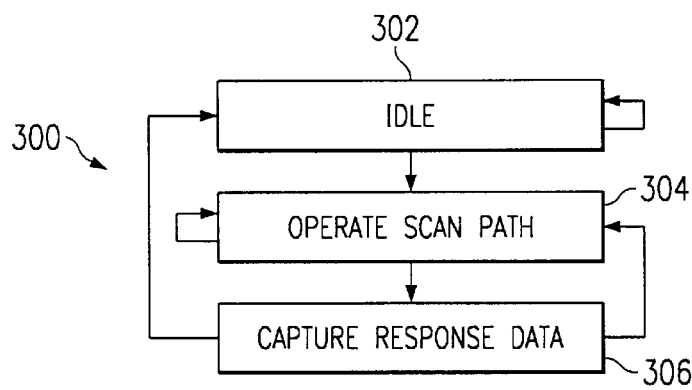
FIG. 3 is a flow diagram of the operation of the circuit of FIG. 1.
Figure 6:
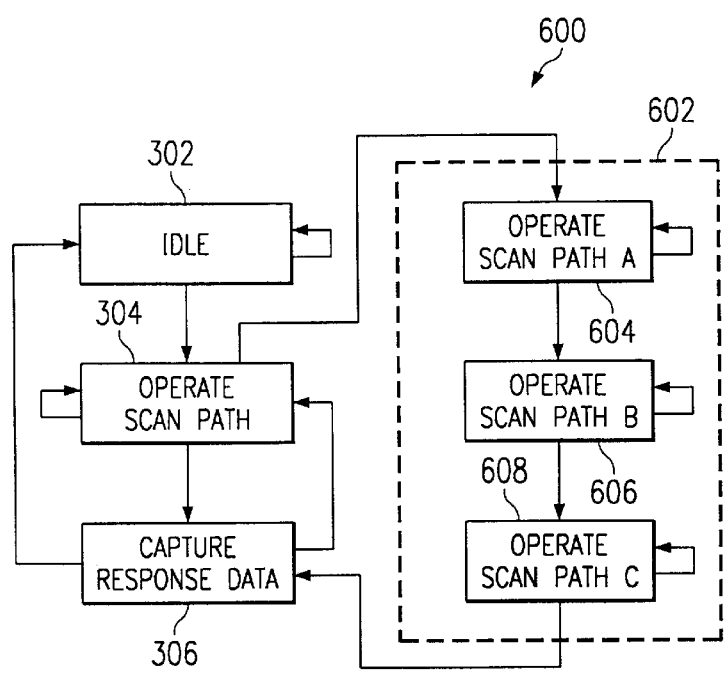
FIG. 6 is a flow diagram of the operation of the circuit of FIG. 5.

FIG. 6 illustrates a simplified example of the combined operation states 600 of the tester 110 and adaptor 504 during test. The operation of tester 110 is the same as previously described in regard to FIG. 3. When the tester transitions to the operate scan path state 304, it begins outputting control to adaptor 504 via path 114. The adaptor responds to the tester control input by translating it into a sequence of separate control outputs 518, 520, and 522 to scan paths A, B, and C. As indicated in adaptor operation block 602, the adaptor first responds to control 114 during adaptor operate state 604 to output control 518, which enables buffer 512 and operates scan path A to input stimulus data from tester 110 via path 118 and output response data to tester 110 via path 120. After scan path A is filled with stimulus and emptied of response, adaptor 504 responds to control 114 during operation state 606 to output control 520, which enables buffer 514 and operates scan path B to input stimulus data from tester 110 via path 118 and output response data to tester 110 via path 120. After scan path B is filled with stimulus and emptied of response, adaptor 504 responds to control 114 during operation state 608 to output control 522, which enables buffer 516 and operates scan path C to input stimulus data from tester 110 via path 118 and output response data to tester 110 via path 120. After scan paths A, B, and C have been filled and emptied, the tester 110 transitions from the operate state 304, through the capture state 306, and back to the operate state 304. During this transition, the adaptor is idle during the capture state 306, but resumes its scan control sequencing operation when the operate state 304 is re-entered. This process of sequentially scanning scan paths A, B, and C, then performing a capture operation to load response data repeats until the test has been performed and tester 110 enters the idle state 302.

During the sequencing of the operation states 604–608, only one of the buffers 512–516 are enabled at a time to output response data to tester 110. Also, the sequencing of the adaptor operation states 604–608 occurs in a seamless manner such that the stimulus data from the tester 110 is input to scan path 502 as it was input to scan path 104, and the response data to tester 110 is output from scan path 502 as it was output from scan path 104. To the tester, the behavior of the scan path 502 and adaptor 504 combination is indistinguishable from the behavior of the scan path 104 in FIG. 1. Thus the test time of the logic 108 in FIG. 5 is the same as the test time of logic 108 in FIG. 1.

From the above description, it is seen that only a subset (i.e. subset A 526, B 530, or C 534) of the stimulus input bus 122 to logic 108 is allowed to ripple at any given time during the adaptor operated scan operation of FIGS. 5 and 6. In contrast, the entire stimulus input bus 122 to logic 108 ripples during the tester operated scan operation of FIGS. 1 and 3. Since, using the present invention, only a subset of the stimulus inputs to logic 108 are allowed to ripple at any one time, less of the aforementioned interconnect and gating capacitance of logic 108 is simultaneously charged and discharged during scan operations. By reducing the amount of logic 108 capacitance being simultaneously charged and discharged during scan operations, the power consumed by logic 108 is advantageously reduced by the present invention.

Example Adaptor Circuit

Figure 2:
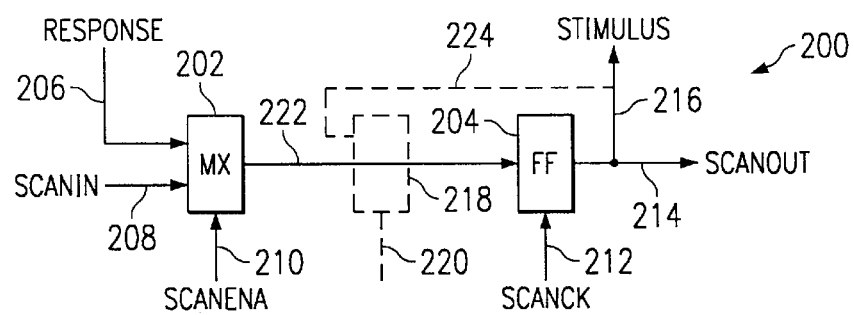
FIG. 2 is a block diagram of a scan cell.
Figure 7:
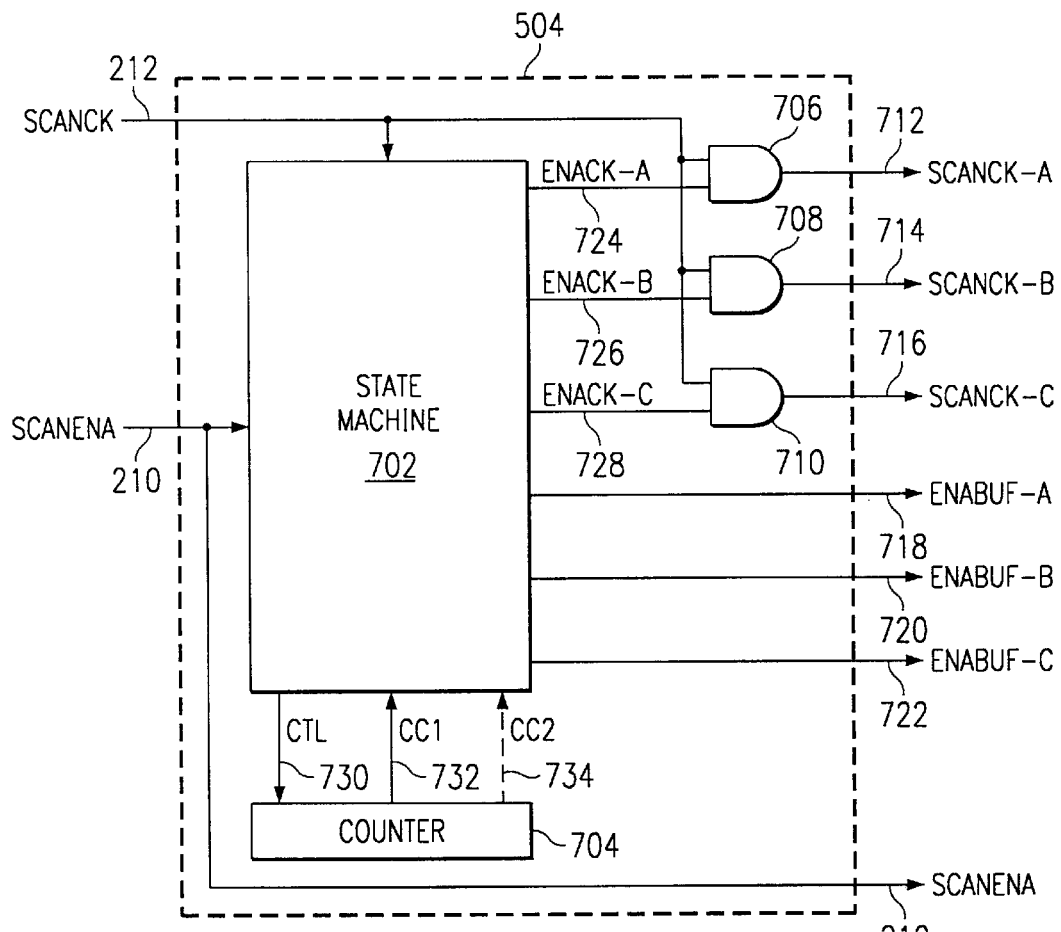
FIG. 7 is a block diagram of the adaptor of FIG. 5.

FIG. 7 illustrates an example adaptor circuit 504 implementation. Adaptor 504 inputs the SCANCK 212 and SCANENA 210 signals from tester 110, via bus 114. Adaptor 504 outputs SCANCK-A signal 712, SCANCK-B signal 714, SCANCK-C signal 716, ENABUF-A signal 718, ENABUF-B signal 720, ENABUF-C signal 722, and the SCANENA signal 210. The SCANENA signal 210 is connected to all scan cell 200 multiplexers 202 as shown in FIG. 2. The SCANCK-A signal 712 is connected, in substitution of SCANCK signal 212, to all scan cell 200 D-FF 204 clock inputs of scan path A. The SCANCK-B signal 714 is connected, in substitution of SCANCK signal 212, to all scan cell 200 D-FF 204 clock inputs of scan path B. The SCANCK-C signal 716 is connected, in substitution of SCANCK signal 212, to all scan cell 200 D-FF 204 clock inputs of scan path C. The ENABUF-A signal 718 is connected to the enable input of buffer 512. The ENABUF-B signal 720 is connected to the enable input of buffer 514. The ENABUF-C signal 722 is connected to the enable input of buffer 516.

Figure 8:
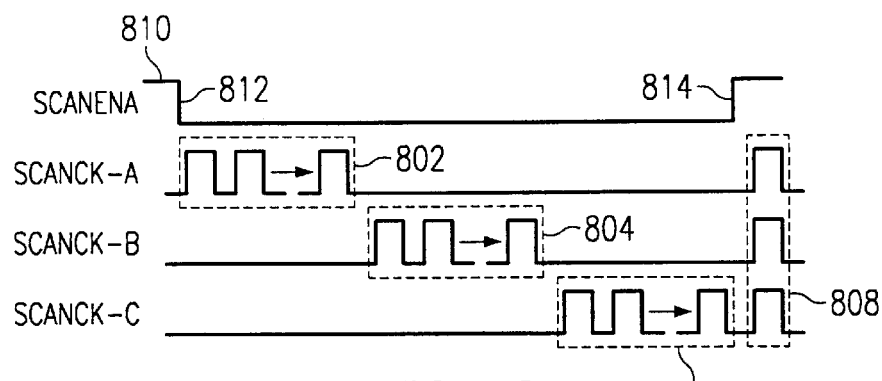
FIG. 8 is a timing diagram for the operation of the adaptor of FIG. 7.

Referring also to FIG. 8, adaptor 504 includes a state machine 702, counter 704, and gates 706–710. During the functional mode of circuit 500, SCANENA is high as indicated at time 810 in the adaptor timing diagram of FIG. 8. While SCANENA is high, state machine 702 outputs control signals 724–728 that enable SCANCK to pass through gates 706–710 to functionally clock all D-FFs 204 of scan paths A, B, and C, via SCANCK-A, SCANCK-B, and SCANCK-C. In this example, the SCANCK is assumed to be the functional clock during the functional mode of circuit 500, and the test clock during test mode of circuit 500. While SCANENA is high, state machine 702 outputs control signals 718–722 to disable buffers 512–516. The scan operation mode is entered by SCANENA going low as indicated at time 812 in FIG. 8. SCANENA goes low when tester 110 transitions from the idle state 302 to the operate state 304 as seen in FIG. 6.

At the beginning of the scan operation mode, the state machine initializes counter 704 via control (CTL) signals 730 and disables scan access to scan paths B and C by disabling SCANCK gates 708 and 710 via signals 726 and 728, and enables scan access to scan path A by; (1) enabling SCANCK gate 706 via signal 724, and (2) enabling buffer 512 via signal 718. Scan access of scan path A occurs over time interval 802 of FIG. 8. During time interval 802, scan path A is accessed to load stimulus data from tester 110 via path 118 and unload response to tester 110 via path 120. While scan path A is being accessed, the state machine operates counter 704 via control signals 730 to determine the number (M/3) of SCANCK-A's to output to scan path A. When the counter reaches a count, indicative of scan path A receiving the correct number (M/3) SCANCK-A inputs, it outputs a first count complete 1 (CC1) signal 732 to state machine 702.

In response to the first CC1 signal, the state machine initializes counter 704 via control signals 730 and disables scan access to scan path A and C, and enables scan access to scan path B over time interval 804. The state machine enables scan access to scan path B by; (1) enabling SCANCK gate 708 via signal 726, and (2) enabling buffer 514 via signal 720. While scan path B is being accessed, the state machine operates counter 704 via control signals 730 to determine the number of SCANCK-B's to output to scan path B. When the counter reaches a count, indicative of scan path B receiving the correct number (M/3) SCANCK-B inputs it outputs a second count complete 1 (CC1) signal 732 to state machine 702.

In response to the second CC1 signal, the state machine initializes counter 704 via control signals 730 and disables scan access to scan path A and B, and enables scan access to scan path C over time interval 806. The state machine enables scan access to scan path C by; (1) enabling SCANCK gate 710 via signal 728, and (2) enabling buffer 516 via signal 722. While scan path C is being accessed, the state machine operates counter 704 via control signals 730 to determine the number of SCANCK-C's to output to scan path C. When the counter reaches a count, indicative of scan path C receiving the correct number (M/3) SCANCK-C inputs, it outputs a third count complete 1 (CC1) signal 732 to state machine 702.

In response to the third CC1 signal, the state machine disables all buffers 512–516 via signals 718–722 and enables gates 706–710 to pass the SCANCK to all scan cells of scan paths A, B, and C. Since scan paths A, B, and C were assumed to contain equal numbers of scan cells (M/3) with the sum of the scan cells in scan paths A, B, and C being equal to the number of scan cells (M) in scan path 104, the third CC1 signal occurs one SCANCK prior to tester 110 setting the SCANENA signal high, at time 814, during its transition from the operate state 304 to the capture state 306 in FIG. 6. While SCANENA is high, at time 808, all scan paths A, B, and C receive a SCANCK, causing them to load response data from logic 108 of FIG. 5. Following the response data load operation at time 808, SCANENA, from tester 110, returns low at time 812 and the above described sequence of separately accessing scan paths A, B, and C repeats until the test completes and tester 110 transitions back to idle state 302 of FIG. 6.

Figure 4:
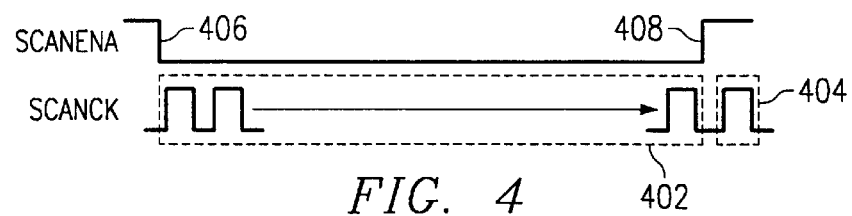
FIG. 4 is a timing diagram.

Contrasting the scan timing diagrams of FIGS. 4 and 8, it is seen that tester 110 provides the same SCANENA timing for both diagrams. For example, (1) the SCANENA high to low transition at time 406 in FIG. 4 is the same SCANENA high to low transition at time 812 in FIG. 8, (2) the SCANENA low to high transition at time 408 in FIG. 4 is the same SCANENA low to high transition at time 814 in FIG. 8, (3) the same number of SCANCKs occur between time 406/812 and time 408/814 in both diagrams, and (4) the same response load SCANCK occurs at time 404 in FIG. 4 and at time 808 in FIG. 8. The difference between the two timing diagrams is seen in the way the adaptor 504 sequentially applies a burst of M/3 SCANCKs to scan paths A, B, and C during time intervals 802, 804, and 806, respectively, such that only one of the scan paths is accessed at a time.

While the example adaptor circuit of FIG. 7 has been described using a gated clocking scheme to control access to the scan cells 200 of scan paths A, B, and C, other example designs of adaptor 504 may be used to control access to other types of scan cells used in scan paths A, B, and C as well. For example, the scan cells 200 of FIG. 2 could be designed to include a state hold multiplexer 218 between the output of multiplexer 202 and input to D-FF 204. The state hold multiplexer 218 could be controlled, via a connection 220 to the ENACK-A 724, ENACK-B 726, and ENACK-C 728 signals from state machine 702, such that it provides a connection 222 between the output of multiplexer 202 and the D-FF input, or it provides a state hold connection 224 between the output of DFF 204 and the input to D-FF 204. If this type of scan cell 200 were used in scan paths A, B, and C, the SCANCK 212 could be directly routed to all the D-FF 204 clock inputs instead of being gated to the D-FF 204 clock inputs via the SCANCK-A, SCANCK-B, and SCANCK-C signals as described for adaptor 504 of FIG. 7. The adaptor 504 would be modified to operate the state holding scan cells by eliminating the gates 706–710 and the SCANCK-A, SCANCK-B, and SCANCK-C outputs, and providing as outputs the ENACK-A 724, ENACK-B 726, and ENACK-C 728 signals from state machine 702. The ENACK-A output would be connected as control input 220 to the state hold multiplexers 218 in the scan cells of scan path A. The ENACK-B output would be connected as control input 220 to the state hold multiplexers 218 in the scan cells of scan path B. The ENACK-C output would be connected as control input 220 to the state hold multiplexers 218 in the scan cells of scan path C.

During functional and response capture operations, the ENACK-A, ENACK-B, and ENACK-C outputs from the modified adaptor 504 would be set to enable a connection between the response signal 206 and input to D-FF 204 of each scan cell, via multiplexer 202 and the state hold multiplexer 218. During scan operations to scan path A (timing interval 802), the ENACK-B and ENACK-C outputs would be set to place the scan cells of scan paths B and C in their state hold connection configuration, and ENACK-A would be set to form a connection between the scan input 208 and input to D-FF 204 of the scan cells in scan paths A, to allow scan access of scan path A. During scan operations to scan path B (timing interval 804), the ENACK-A and ENACK-C outputs would be set to place the scan cells of scan paths A and C in their state hold connection configuration, and ENACK-B would be set to form a connection between the scan input 208 and input to D-FF 204 of the scan cells in scan paths B, to allow scan access of scan path B. During scan operations to scan path C (timing interval 806), the ENACK-A and ENACK-B outputs would be set to place the scan cells of scan paths A and B in their state hold connection configuration, and ENACK-C would be set to form a connection between the scan input 208 and input to D-FF 204 of the scan cells in scan paths C, to allow scan access of scan path C.

The modified adaptor 504 and state hold type scan cells described above operate to achieve the low power mode of scan access to scan paths A, B, and C as previously described with the original adaptor 504 and scan cell 200. The difference between the two adaptor/scan cell combinations described above is that the original adaptor/scan cell combination operates in a gated clock mode (i.e. uses gated clocks SCANCK-A, SCANCK-B, and SCANCK-C) and the modified adaptor/scan cell combination operates in a synchronous clock mode C (i.e. uses the SCANCK).

Scan Path Adaptation

As mentioned previously, test synthesis tools exist that are capable of automatically instantiating scan architectures similar to the one shown in FIG. 1. These tools are capable of analyzing logic 108 and its stimulus and response interface to scan path 104 to determine what stimulus test pattern data needs to input from tester 110 to logic 108 via scan path 104 and what response test patterns data is expected to be output to tester 110 from logic 108 via scan path 104. To reduce the effort required to adapt the synthesized scan architecture of FIG. 1 into the low power scan architecture of FIG. 5, the scan path adaptation process described below is preferably performed.

Figure 9:
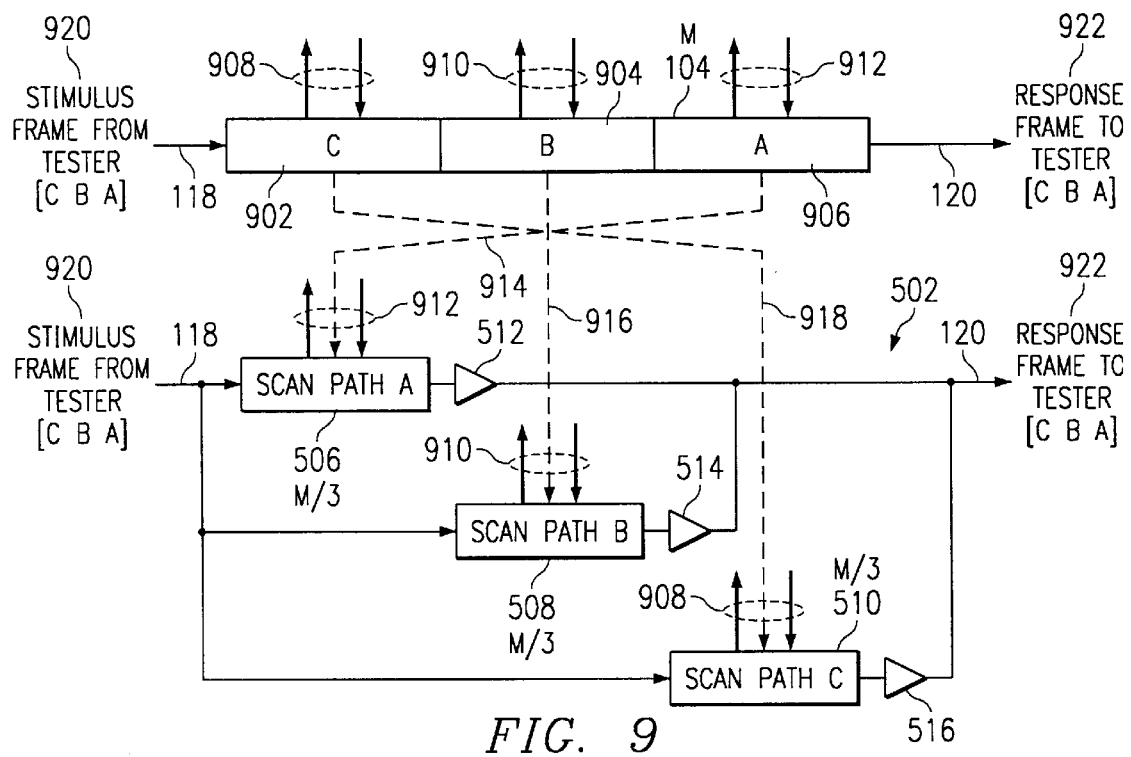
FIG. 9 is a block diagram of the scan paths arranged according to the present invention.

In FIG. 9, scan path 104 is shown receiving stimulus frames 920 from tester 110 via connection 118 and outputting response frames 922 to tester 110 via connection 120. The term "frame" simply indicates the number of scan bits (M) required to fill the scan path 104 with stimulus data from tester 110 and empty the scan path 104 of response data to tester 110 during the operate state 304 of FIG. 3. The test may require a large number of stimulus and response frame communications to test logic 108. To achieve the low power mode of operation of the present invention, it is desired to reorganize scan path 104 into a plurality of separate scan paths. In this example, the reorganization of scan path 104 results in the previously described scan path 502, which contains three separate scan paths 506–510. It is also desired to adapt scan path 104 into scan path 502 in such a way as to avoid having to make any modifications to the stimulus and response test pattern frames 920 and 922.

As previously mentioned in regard to FIG. 5, the number (M) of scan cells in scan path 104, is assumed divisible by three such that scan path 104 can be seen to comprise three separate scan segments A, B, and C, each scan segment containing a third (M/3) of the scan cells (M) in scan path 104. Scan segment A of 104 contains a subset 912 of the stimulus and response signals of the overall stimulus and response busses 122 and 124 respectively. Scan segment B of 104 contains a subset 910 of the stimulus and response signals of the overall stimulus and response busses 122 and 124 respectively. Scan segment C of 104 contains a subset 908 of the stimulus and response signals of the overall stimulus and response busses 122 and 124 respectively.

Each stimulus scan frame 920 scanned into scan path 104 from tester 110 can be viewed as having bit position fields [CBA] that fill scan segments C, B, and A, respectively. For example, following a scan operation, bit position field A is loaded into segment A, bit position field B is loaded into segment B, and bit position field C is loaded into segment C. Likewise, each response scan frame 922 scanned from scan path 104 to tester 110 can be viewed as having bit position fields [CBA] that empty scan segments C, B, and A, respectively. For example, following a scan operation, bit position field A is unloaded from segment A, bit position field B is unloaded from segment B, and bit position field C is unloaded from segment C. To insure that the stimulus 920 and response 922 frames are reusable when scan path 104 is reorganized into the low power configuration, the reorganization process occurs as described below.

Scan path 104 segment A is configured as a separate scan path A 506, as indicated by the dotted line 914. Scan path 104 segment B is configured as a separate scan path B 508, as indicated by the dotted line 916. Scan path 104 segment C is configured as a separate scan path C 510, as indicated by the dotted line 918. The scan inputs to scan paths A, B, and C 506–510 are connected to tester 110 via connection 118. The scan outputs from scan paths A, B, and C 506–510 are connected, via the previously described 3-state buffers 512–516, to tester 110 via connection 120. Each separate scan path 506–510 maintains the same stimulus and response bussing connections 908–912 to logic 108.

Operating the reorganized scan path 502 using the tester 110 used to operate scan path 104 results in the following behavior. This behavior assumes adaptor 504 has been inserted between the tester 110 and scan path 502, to control scan path 502 as described in FIGS. 5, 6, 7, and 8. During input and output of stimulus and response frames [CBA] 920 and 922 respectively, (1) stimulus bit field A is directly loaded into scan path A from tester 110 via path 118 as response bit field A is directly unloaded from scan path A to tester 110 via path 120, (2) stimulus bit field B is directly loaded into scan path B from tester 110 via path 118 as response bit field B is directly unloaded from scan path B to tester 110 via path 120, and (3) stimulus bit field C is directly loaded into scan path C from tester 110 via path 118 as response bit field C is directly unloaded from scan path C to tester 110 via path 120. As seen from this description, when scan path 104 is reorganized into scan path 502 as described, scan path 502 can use the same stimulus and response frames originally intended for use by scan path 104. Thus no modifications are necessary to the stimulus and response test pattern frames produced by the test synthesis tool.

In the case where scan path 104 contains a number of scan cells (M) that is not equally divisible by the desired number of separate scan paths (N) in scan path 502, the length of one of the separate scan paths can be adjusted to compensate scan path 502 for proper input and output of the scan frames 920–922. For example, if the number of scan cells (M) in scan path 104 is not equally divisible by the number of separate scan paths (N) required to achieve a desired low power mode of operation, M can be increased by adding a value (Y) such that M+Y is equally divisible by N. Once this is done, N separate scan paths may be formed. N−1 of the separate scan paths will have a length (M+Y)/N and one of the separate scan paths will have a length of ((M+Y)/N)−Y. For example, if scan path 104 had 97 scan cells (M), scan path A and B of 502 would each be configured to contain 33 scan cells [(M+Y)/N=(97+2)/3=33], while scan path C would be configured to contain 31 scan cells [(M+Y)/N)−Y=((97+2)/3)−2=31]. In this example, the scan frame 920–922 [CBA] segments would be seen as; segment A=33 bits, segment B=33 bits, and segment C=31 bits.

When scan path 502 is formed to include the scan frame compensation technique described above, the operation of adaptor 504 is adjusted so it can properly control the compensated scan path 502. In FIGS. 7 and 8, the adaptor 504 circuit and operation was described in detail. Assuming the adaptor timing diagram in FIG. 8 is being used to communicate scan frames to a scan path 502 consisting of the above mentioned 33-bit scan path A, 33-bit scan path B, and 31-bit scan path C, the following changes are required to adaptor 504. Adaptor state machine 702 continues to monitor the CC1 732 output from counter 704, as previously described, to determine when to stop 33-bit scan operations to scan paths A and B at timing intervals 802 and 804, respectively, in FIG. 8. However, since the scan timing interval 806 to scan path C is different from the scan timing intervals 802 and 804, the state machine operation is altered to where it monitors the count complete 2 (CC2) output 734 from counter 704 to stop the 31-bit scan operation to scan path C. The CC2 734 output is designed to indicate when the 31-bit scan operation to scan path C should be stopped, whereas the CC1 732 is designed to indicate when the 33-bit scan operation to scan paths A and B should be stopped.

Parallel Scan Architectures

Figure 10:
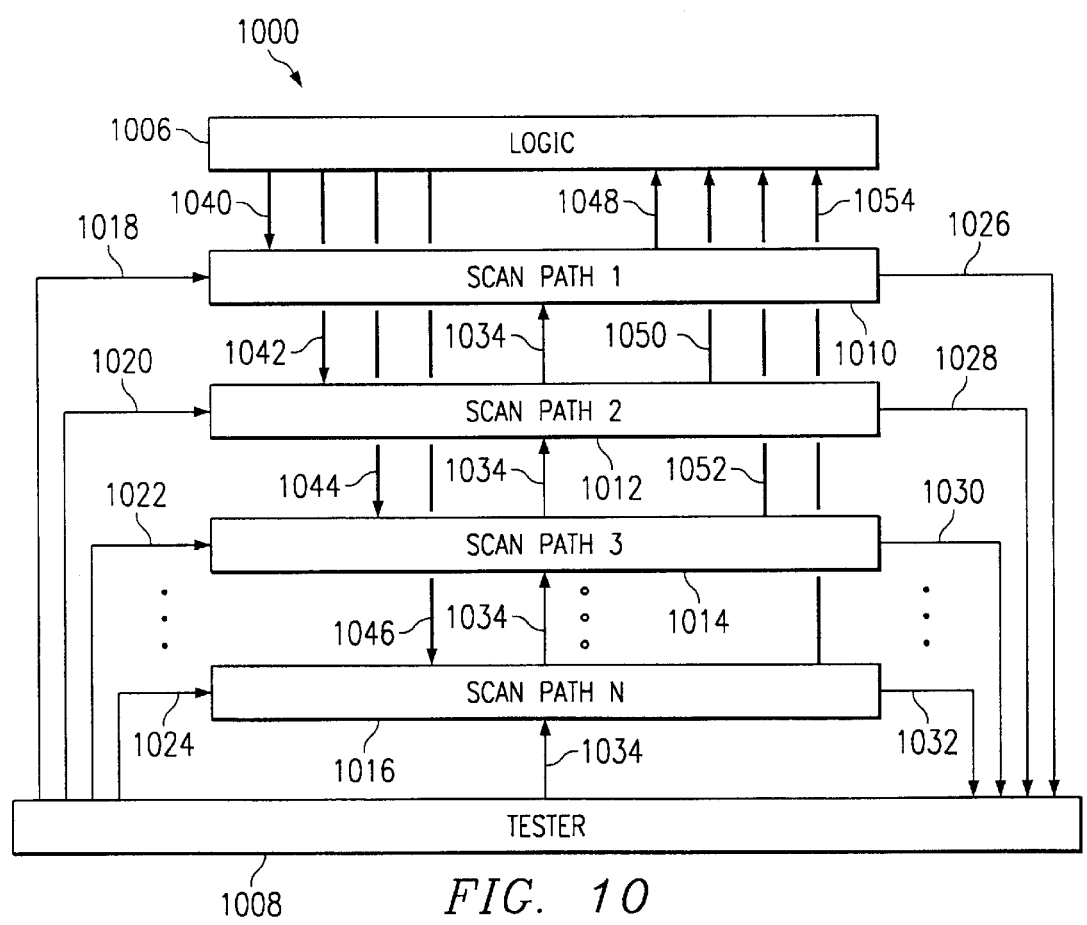
FIG. 10 is a block diagram of a circuit using a conventional parallel scan architecture.

FIG. 10 illustrates circuit 1000 that has been configured for testing using a conventional parallel scan architecture. As with the previous single scan architecture of FIG. 1, parallel scan architectures may be synthesized and automatically inserted into ICs to serve as embedded testing mechanisms. The parallel scan architecture includes separate scan paths 1–N 1010–1016 and an interface to tester 1008. During the functional mode of circuit 1000, the D-FFs 204 of scan paths 1–N are configured to operate with logic 1006 to provide the circuit 1000 functionality. During test mode, the D-FFs 204 of scan path 1–N are configured to operate with tester 1008 to provide testing of logic 1006. Scan paths 1–N receive response from logic 1006 via paths 1040–1046, and output stimulus to logic 1006 via paths 1048–1054. Scan paths 1–N receive serial stimulus from tester 1008 via paths 1010–1024, and output serial response to tester 1008 via paths 1026–1032. Scan paths 1–N receive control input from tester 1008 via path 1034.

Figure 11:
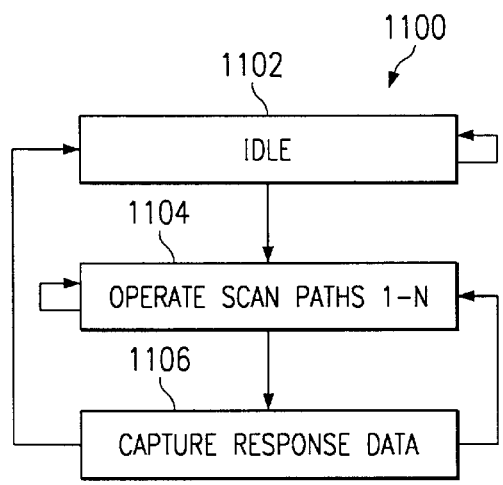
FIG. 11 is a flow chart for the operation of the parallel scan path of FIG. 10.

When circuit 1000 is first placed in the test configuration of FIG. 10, the parallel scan architecture will be controlled, by tester 1008, to be in the idle state 1102 of the test operation diagram 1100 in FIG. 11. From the idle state 1102, tester 1008 will transition the parallel scan architecture into the operate scan paths 1–N state 1104. During the operate state 1104, tester 1008 outputs control to scan paths 1–N causing the scan paths to input stimulus from tester 1008 via paths 1018–1024 and output response to tester 1008 via paths 1026–1032. After the scan paths 1–N are filled with stimulus and emptied of response, tester 1008 transitions to the capture state 1106 to load the next response data, then returns to the operate state 1104 to input the next stimulus data and empty the next response data. After all stimulus and response data patterns have been applied, by repeating transitions between the operate and capture states, the test is complete and the tester returns to the idle state 1102.

The structure and operation of the parallel scan architecture of FIG. 10 is very similar to the structure and operation of the single scan architecture of FIG. 1. Some notable differences exist between the scan architectures of FIGS. 1 and 10. (1) In FIG. 10, multiple parallel scan paths 1–N are formed during the test configuration, as opposed to the single scan path 104 formed during the FIG. 1 test configuration. (2) In FIG. 10, tester 1008 outputs multiple parallel stimulus outputs 1018–1024 to scan paths 1–N, as opposed to tester 110 outputting a single stimulus output 118 to scan path 104. (3) In FIG. 10, tester 1008 inputs multiple parallel response outputs 1026–1032 from scan paths 1–N, as opposed to tester 110 inputting a single response output 120 from scan path 104.

The parallel scan architecture of FIG. 10 suffers from the same power consumption problem described in the scan architecture of FIG. 1, since during scan operations, logic 1006 receives simultaneous rippling stimulus inputs from scan paths 1–N. Thus, the parallel scan architecture of FIG. 10 can be improved to where it consumes less power during test by adapting it into a low power parallel scan architecture as described below.

Low Power Parallel Scan Architecture

Figure 12:
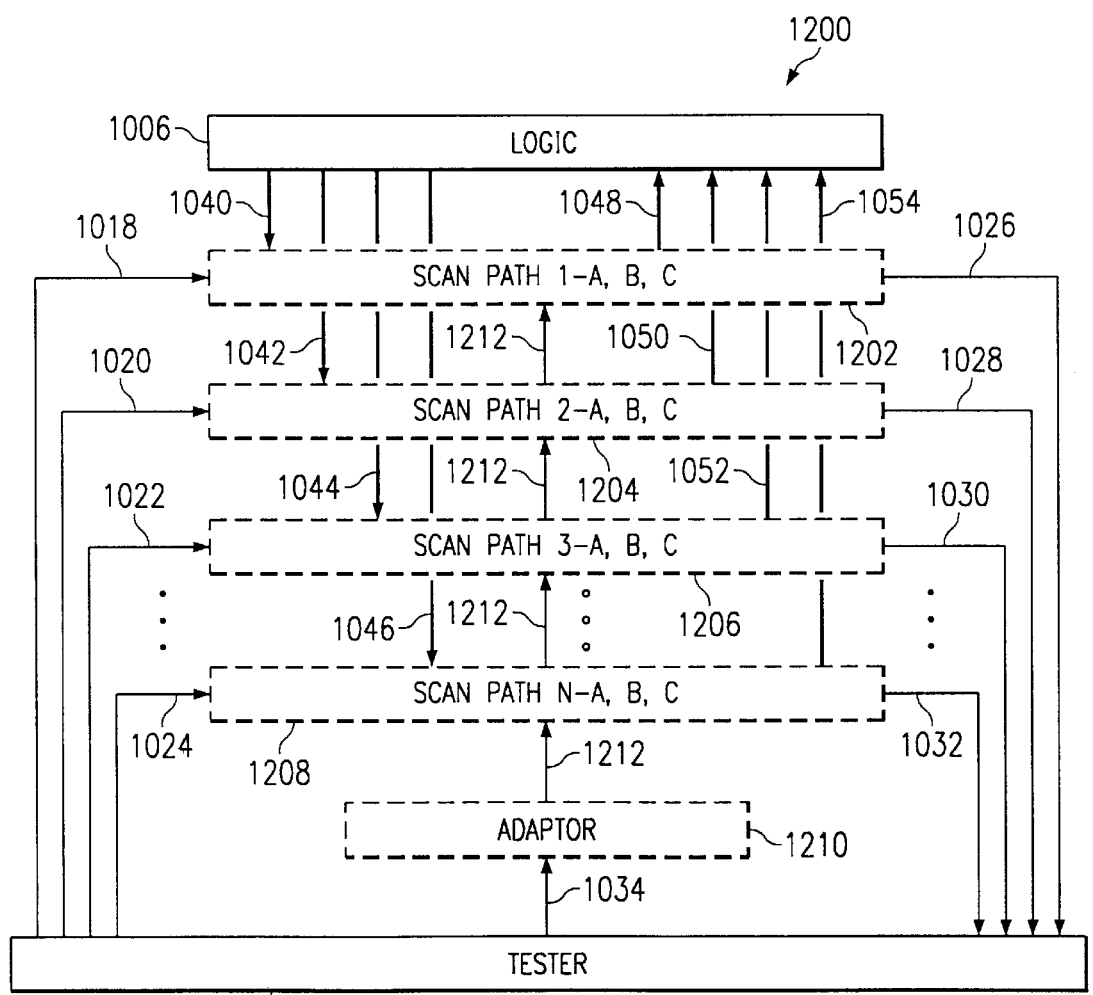
FIG. 12 is a block diagram of a parallel scan path arranged according to the present invention.

FIG. 12 illustrates the FIG. 10 parallel scan architecture after it has been adapted for low power operation. The adaptation process, as previously described in the low power adaptation of the FIG. 1 scan architecture, involves the following steps. Step one includes reconfiguring scan paths 1–N 1010–1016 of FIG. 10 into scan paths 1–N 1202–1208 of FIG. 12, wherein each scan path 1–N 1202–1208 contains multiple separate scan paths between their respective inputs 1018–1024 and outputs 1026–1032. In this example, it is assumed that each scan path 1–N 1202–1208 has been reconfigured into separate scan paths A, B, and C, as scan path 104 of FIG. 1 was reconfigured into scan path 502 of FIG. 5. Step two includes inserting adaptor 1210 between tester 1008 and scan paths 1–N 1202–1208. In this example, it is assumed that adaptor 1210 is very similar to adaptor 504 in the way it operates the separate scan paths A, B, and C in each of the scan paths 1–N 1202–1208, so only the brief operation description of adaptor 1210 is given below.

As seen in the operation diagram of FIG. 13, adaptor 1210 responds to tester 1008 entering the operate state 1104 to: (1) simultaneously operate the scan paths A of scan paths 1202–1208, via control bus 1212, to input stimulus from tester 1008 and output response to tester 1008, then (2) simultaneously operate the scan paths B of scan paths 1202–1208, via control bus 1212, to input stimulus from tester 1008 and output response to tester 1008, then (3) simultaneously operate the scan paths C of scan paths 1202–1208, via control bus 1212, to input stimulus from tester 1008 and output response to tester 1008. Adaptor 1210 suspends scan operations to scan paths 1202–1208 when tester 1008 enters the capture state 1106, and resumes the above described scan operation sequence to the scan paths A, B, and C of scan paths 1202–1208 when tester 1008 re-enters the operate state 1104. After the test completes, tester 1008 enters the idle state 1102 and the adaptor 1210 is disabled. From this description, the operation of adaptor 1210 is seen to mirror the operation of adaptor 504 with the exception that adaptor 1210 controls multiple scan paths A, multiple scan paths B, and multiple scan paths C during its control state diagram sequence 1302. In contrast, adaptor 504 controlled only one scan path A, one scan path B, and one scan path C during its control state diagram sequence 602.

Direct Synthesis of Low Power Scan Architectures

While the process of adapting pre-existing scan architectures for low power operation has been described, it is anticipated that, once the low power benefit of the present invention is understood, test synthesis tools will be improved to provide direct synthesis of low power scan architectures. Direct synthesis of low power scan architectures will eliminate the need to perform the adaptation steps previously described, since the steps will be incorporated into the synthesis process. A direct synthesis of a single scan path low power scan architecture would result in the direct instantiation of a low power scan architecture similar to the one described and shown in regard to FIG. 5. A direct synthesis of a parallel scan path low power scan architecture would result in the direct instantiation of a low power scan architecture similar to one described and shown in regard to FIG. 12.

Adapting Scan Controller Architectures for Low Power Operation

FIG. 14 illustrates a circuit 1400 configured into a conventional scan controller based scan architecture. The scan architecture consists of logic 1410, scan paths 1412–1418, and scan controller 1402. The scan paths are coupled to logic 1410 via stimulus and response paths 1424, to scan controller 1402 via path 1404, and to tester 1408 via scan inputs 1420 and scan outputs 1422. The scan controller is coupled to tester 1408 via path 1406. While the scan controller based architecture of FIG. 14 uses parallel scan paths 1412–1418, a single scan path architecture, such as the one shown in FIG. 1, could be used as well. The scan architecture operates to test logic 1410 as previously described in regard to the scan architecture of FIG. 10, with the exception that the tester 1408 inputs control to scan controller 1402 instead of directly to the scan paths. In response to tester control input, the scan controller outputs scan control 1404 to scan paths 1412–1418 to execute the test. An example control diagram for the scan controller is shown in FIG. 15. While various different control diagrams for various different scan controllers could be shown, the diagram of FIG. 15 reflects the basic scan operations typically required by any scan controller circuit 1402. Those operations being, an idle state 1502, an operate scan state 1504, and a capture response state 1506. It is understood that various other scan operation states could exist in the control diagram.

The scan controller of FIG. 14 could be anyone of many types of scan controller circuits. Two examples of some of the types of scan controllers that could be represented by scan controller 1402 are listed below.

In one realization, scan controller 1402 could represent the test access port (TAP) controller circuit of IEEE standard 1149.1, A Standard Test Access Port and Boundary Scan Architecture. A description of the IEEE TAP being used to control scan access to parallel scan paths is described in regard to FIG. 14*a* of U.S. Pat. No. 5,526,365 by Whetsel and is incorporated herein by reference. The TAP operation states differ from the operation state diagram of FIG. 15, but in general it contains the fundamental scan 1504 and capture 1506 states.

Figure 17:
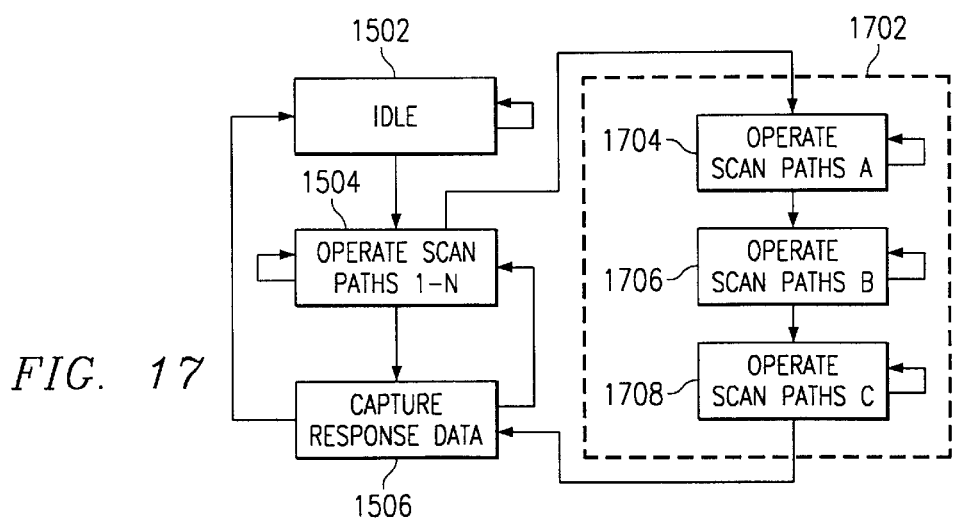
FIG. 17 is a flow chart of the operation of the circuit of FIG. 16.

In another realization, scan controller 1402 could represent the boundary input/output serializer (BIOS) circuit, described in regard to FIG. 17 of the above mentioned U.S. Pat. No. 5,526,365, being used to control scan access to parallel scan paths. The BIOS description in U.S. Pat. No. 5,526,365 is incorporated herein by reference. The BIOS operation also differs from the operation state diagram of FIG. 15, but in general it contains the fundamental scan 1504 and capture 1506 states.

In still another realization, scan controller 1402 could represent the addressable test port (ATP) circuit, described in U.S. Pat. No. 6,650,734, being used to control scan access to parallel scan paths. The U.S. Pat. No. 6,650,734 is incorporated herein by reference. As with the TAP and BIOS, the ATP operation differs from the operation state diagram of FIG. 15, but in general it contains the fundamental scan 1504 and capture 1506 states.

Figure 16:
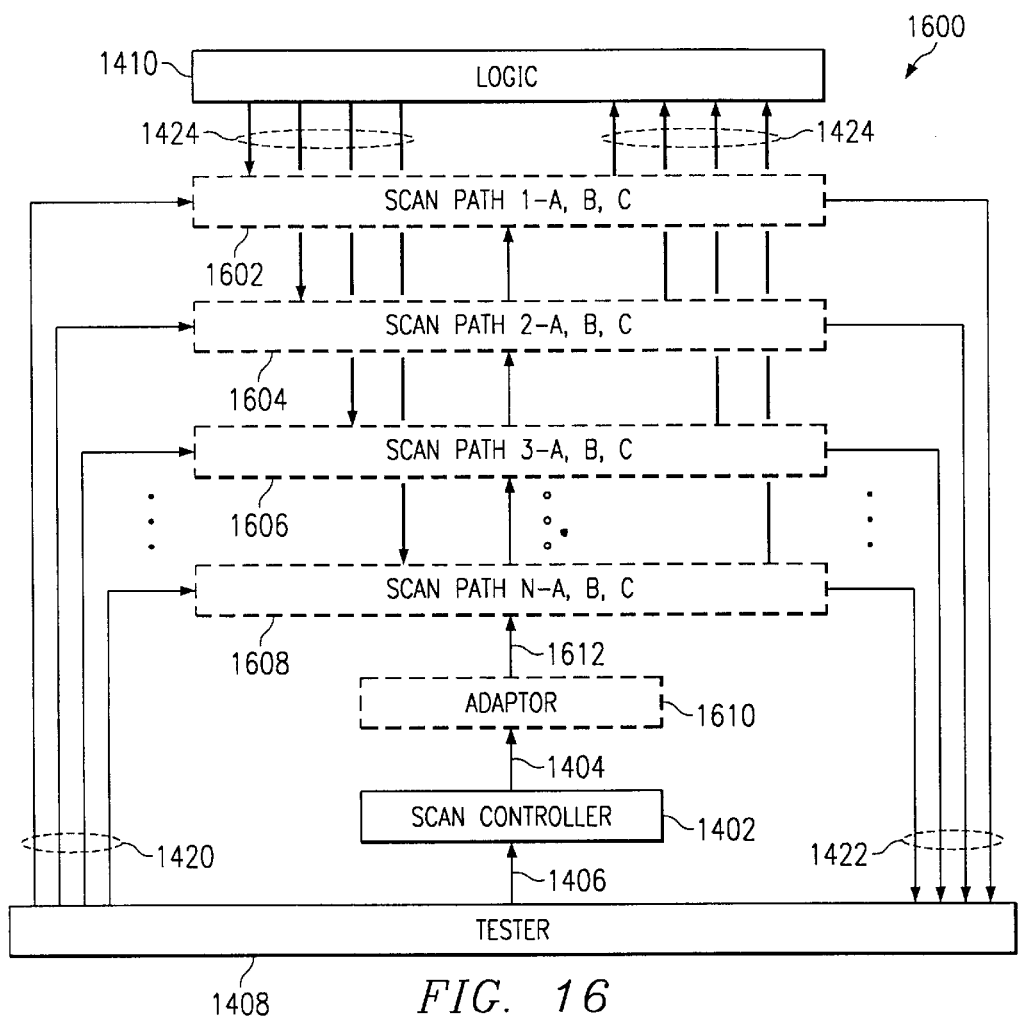
FIG. 16 is a block diagram of the circuit of FIG. 14 according to the present invention.

FIG. 16 illustrates the two modification steps to the scan controller based scan architecture of FIG. 15 to achieve the desired low power mode of operation. In the first modification step, as with the previously described modification of the FIG. 10 scan architecture into the FIG. 12 low power scan architecture, each of the scan paths 1412–1418 of FIG. 14 are converted into low power scan paths 1602–1608. Each of the low power scan paths 1602–1608 of FIG. 16 contain separate scan path segments A, B, and C arranged as shown and described previously in regard to FIG. 5.

In the second modification step, an adaptor 1610 is inserted between the scan controller 1402 and scan paths 1602–1608. Adaptor 1610 inputs control from scan controller 1402 via path 1404 and outputs control to scan paths 1602–1608 via path 1612. From the general control state diagram example shown in FIG. 17, adaptor 1610 responds to scan controller 1402 output states (idle state 1502, operate scan paths 1–N state 1504, and capture response data state 1506) to output control state sequences 1702 (operate scan paths A 1704, operate scan paths B 1706, and operate scan paths C 1708) to scan paths 1602–1608. As with previous adaptor descriptions, the control output from adaptor 1610 to scan paths 1602–1608 operates the scan paths 1602–1608 such that only one of the scan path segment groups (i.e. segment group A, B, or C) of scan paths 1602–1608 are enabled to shift data at a time.

Since the adaptor's 1610 control input 1404 may come from any type of scan controller, such as the TAP, BIOS, or ATP mentioned above, the adaptor 1610 design will need to be customized to interface with the specific scan controller 1402 being used. In general, an adaptor 1610 can interface to any given scan controller by simply sensing when the scan controller starts a scan operation and sensing when the scan controller stops a scan operation. For example, when a scan controller starts a scan operation the adaptor starts executing its operate scan paths A, B, and C state sequence, and when the scan controller stops a scan operation the adaptor stops executing its operate scan paths A, B, and C state sequence.

While FIG. 16 illustrates the adaptor 1610 as being a circuit separate from scan controller circuit 1402, the two circuits can be designed as one circuit. For example, if it is desired to provide the low power scan mode of the present invention in a scan controller based architecture, the scan controller and the adaptor circuit functions may be integrated into a single circuit realization. The previously mentioned IEEE 1149.1 TAP scan controller may indeed be designed to include the adaptor's 1610 scan path segment A, B, and C sequencing functionality. Likewise, the previously mentioned BIOS or ATP scan controllers may indeed be designed to include the adaptor's 1610 scan path segment A, B, and C sequencing functionality.

Daisy-chained Low Power Scan Paths

Figure 18:
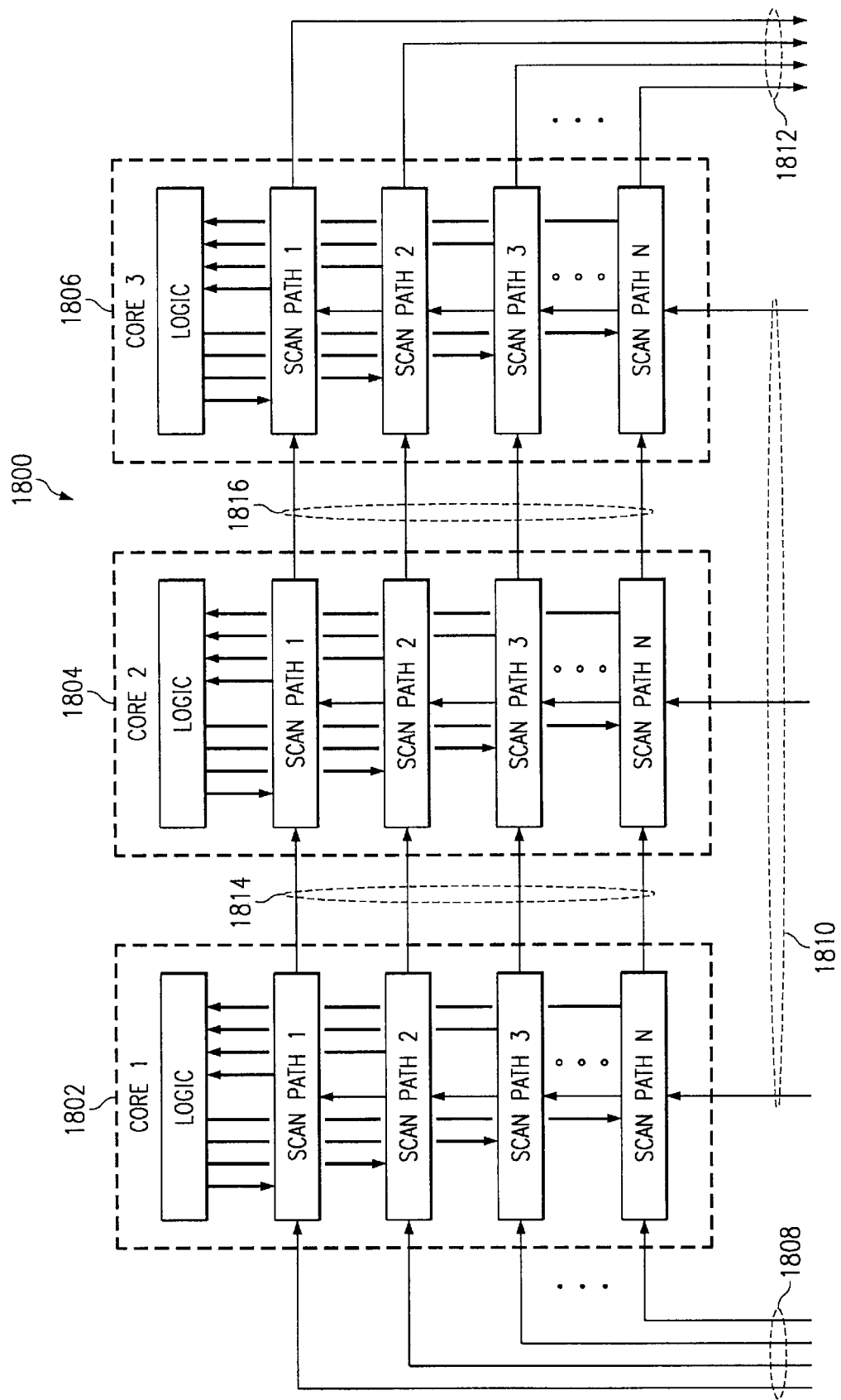
FIG. 18 is a block diagram of an integrated circuit having three core circuits and conventional scan paths.

FIG. 18 illustrates an IC 1800 having three intellectual property core circuits (core1, core2, core3) 1802–1806 configured into a daisy-chained arrangement for simultaneous parallel scan testing. Cores 1–3 could each be a DSP, CPU, or other circuit type. In the scan test configuration, each core includes a logic circuit to be tested, and N scan paths for communicating stimulus and response test patterns to the logic circuit. The scan paths 1–N of cores 1–3 are assumed to have the same length. The scan inputs of the core 1 scan paths are connected to a tester, such as tester 1008 of FIG. 10, via scan input paths 1808. The scan outputs of the scan paths of core 1 are connected to the scan inputs of the core 2 scan paths via connections 1814. The scan outputs of the scan paths of core 2 are connected to the scan inputs of the core 3 scan paths via connections 1816. The scan outputs of the core 3 scan paths are connected to a tester, such as tester 1008 of FIG. 10, via scan output paths 1812. The scan paths of cores 1–3 are connected to a control bus 1810 to synchronize their daisy-chained scan test operation. Control bus 1810 could be the control bus 1034 of tester 1008 of FIG. 10, or it could be the control bus 1404 of scan controller 1402 of FIG. 14.

During test operation, the scan paths of cores 1–3 are controlled to repeat the steps of: (1) performing a capture operation to load response data from their respective logic circuits, and (2) performing a shift operation to unload response data to the tester via path 1812 and load the next stimulus data from the tester via path 1808. The duration of the shift operation is such that all the daisy-chained scan paths are emptied of their captured response data and filled with their next stimulus data. From inspection of FIG. 18 it is seen that during the shift operation, the logic circuits of cores 1–3 receive rippling stimulus inputs which consumes power in the logic circuits.

Figure 19:
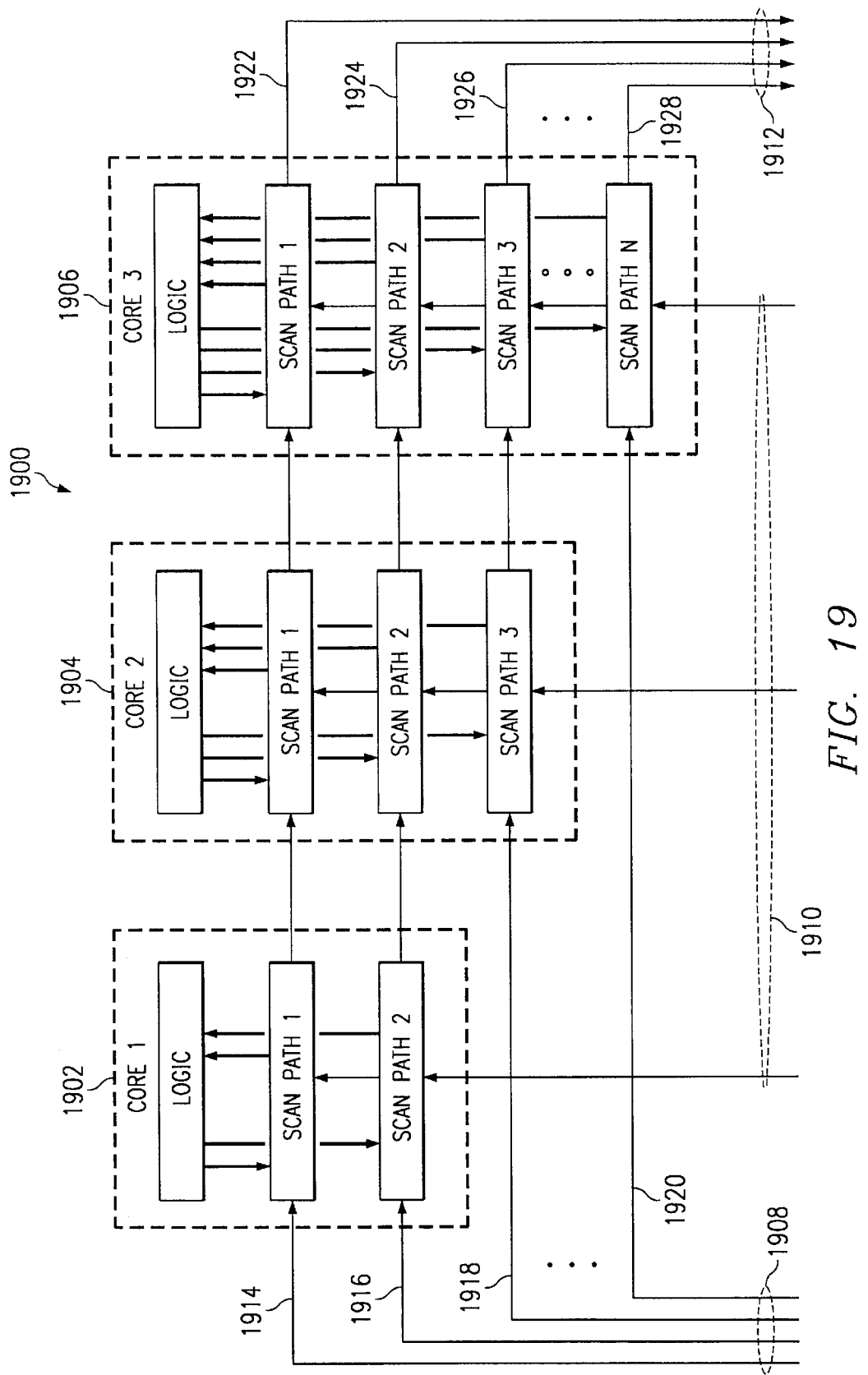
FIG. 19 is a block diagram of another integrated circuit having three cores and unequal conventional scan paths.

FIG. 19 illustrates an IC 1900 having three intellectual property core circuits (core1, core2, core3) 1902–1906 configured into a daisy-chained arrangement for simultaneous parallel scan testing. This example is provided to demonstrate that cores 1–3 could each have a different number of scan paths when configured into the test mode. For example, core 1 has two scan paths, core 2 has three scan paths, and core 3 has N scan paths. Scan paths 1 and 2 of cores 1–3 are serially connected between the tester scan outputs 1914 and 1916 of connection 1908 and the tester scan inputs 1922 and 1924 of connection 1912. Scan paths 3 of core 2 and core 3 are serially connected between the tester scan output 1918 of connection 1908 and the tester scan input 1926 of connection 1912. Scan paths 4–N of core 3 are serially connected between the tester scan outputs 1920 of connection 1908 and the tester scan inputs 1928 of connection 1912.

As in the FIG. 18 example, each core 1–3 of FIG. 19 includes a logic circuit to be tested, and stimulus and response connections between the logic circuits and the respective scan paths of each core. As in FIG. 18, the scan paths of cores 1–3 are assumed to have the same length. The scan paths of cores 1–3 are connected to a control bus 1910 to synchronize their daisy-chained scan test operation. As mentioned in regard to FIG. 18, control bus 1910 could come from a tester, such as tester 1008 or from a scan controller, such as scan controller 1402.

During test operation, the scan paths of cores 1–3 are controlled to repeat the steps of: (1) performing a capture operation to load response data from their respective logic circuits, and (2) performing a shift operation to unload response data to the tester via path 1912 and load the next stimulus data from the tester via path 1908. The duration of the shift operation is such that the longest daisy-chained scan path arrangement (i.e. the daisy-chain arrangement of scan paths 1 and 2 of cores 1–3) is emptied of captured response data and filled with next stimulus data. The scan patterns communicated to the daisy-chained scan paths 3 between tester connections 1918 and 1926 will be padded with bit positions to balance their bit length to the bit length of the scan patterns communicated to the daisy-chained scan paths 1 and 2 between tester connections 1914, 1916, 1922, and 1924. Likewise, the scan patterns communicated to scan paths 4–N between tester connections 1920 and 1928 will be padded with additional bit positions to balance their length to the bit length of the scan patterns communicated to the daisy-chained scan paths 1 and 2 between connections 1914, 1916, 1922, and 1924. From inspection of FIG. 19 it is seen that during the shift operation, the logic circuits of cores-1–3 receive rippling stimulus inputs which consumes power in the logic circuits.

Adapting Daisy-Chained Scan Paths for Low Power Operation

Figure 20:
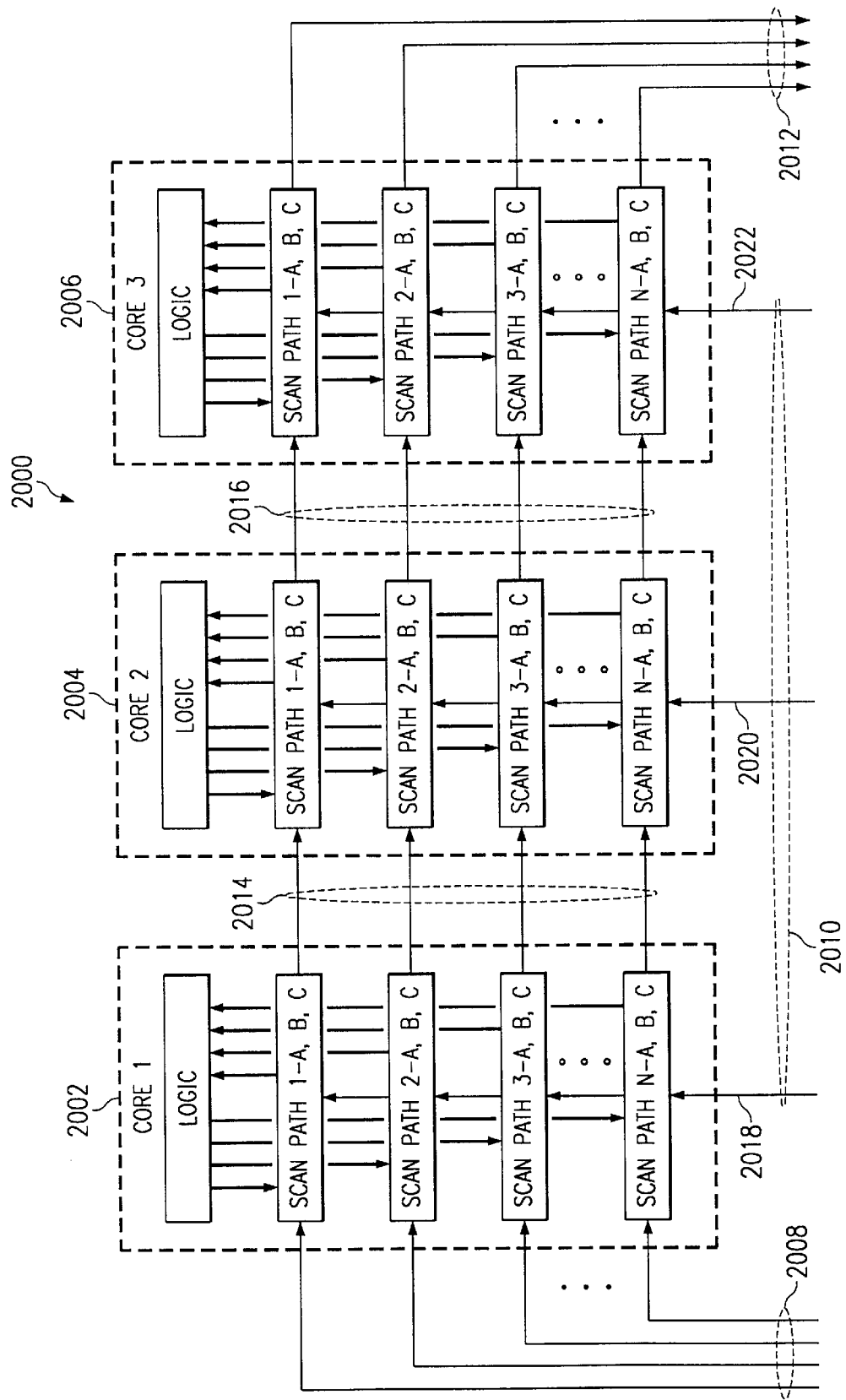
FIG. 20 is a block diagram of the circuit of FIG. 18 with scan paths according to the present invention.

FIG. 20 illustrates IC 2000, which is the IC 1800 after the scan paths 1–N of cores 1–3 of IC 1800 have been converted into low power scan paths 1–N. Besides the conversion of the conventional scan paths 1–N into low power scan paths 1–N, the IC 2000 is the same as that of IC 1800. The cores 1–3 of FIG. 20 are the cores 1–3 of FIG. 18. The logic circuits of the cores 1–3 of FIG. 20 are the logic circuits of cores 1–3 of FIG. 18. The scan input connections 2008 of FIG. 20 are the scan input connections 1808 from the tester of FIG. 18. The scan output connections 2012 of FIG. 20 are the scan output connections 1812 to the tester of FIG. 18. The scan path connections 2014 and 2016 of FIG. 20 are the scan path connections 1814 and 1816 of FIG. 18. The low power scan paths of FIG. 20 are assumed to each be partitioned into separate scan path segments A, B, and C, as previously described in regard to the partitioning of scan path 104 of FIG. 1 into low power scan path 502 of FIG. 5. The scan paths of cores 1–3 of FIG. 20 are connected to a control bus 2010 to synchronize their daisy-chained scan test operation. The control bus 2010 of FIG. 20 differs from the control bus of FIG. 18 in that it comes from an adaptor, such as from adaptor 504 of FIG. 5, adaptor 1210 of FIG. 12, or adaptor 1610 of FIG. 16.

During test operation, the low power scan paths of cores 1–3 are controlled to repeat the steps of: (1) performing a capture operation to load response data from their respective logic circuits, and (2) performing an adaptor controlled shift operation to unload response data to the tester via path 2012 and load the next stimulus data from the tester via path 2008. The adaptor control sequences through the operate scan paths A, B, and C states as previously described in regard to state diagram 1302 of FIG. 13. The duration of the adaptor controlled shift operation is such that all the daisy-chained low power scan paths are emptied of their captured response data and filled with their next stimulus data. From inspection of FIG. 20 it is seen that during the adaptor controlled shift operation, the logic circuits of cores-1–3 receive rippling stimulus inputs only from the currently shifting scan paths A, B, or C of each low power scan path. Thus the power consumed by the core 1–3 logic circuits in FIG. 20 during shift operations is reduced from the power consumed by the core 1–3 logic circuits of FIG. 18 during shift operations.

Figure 21:
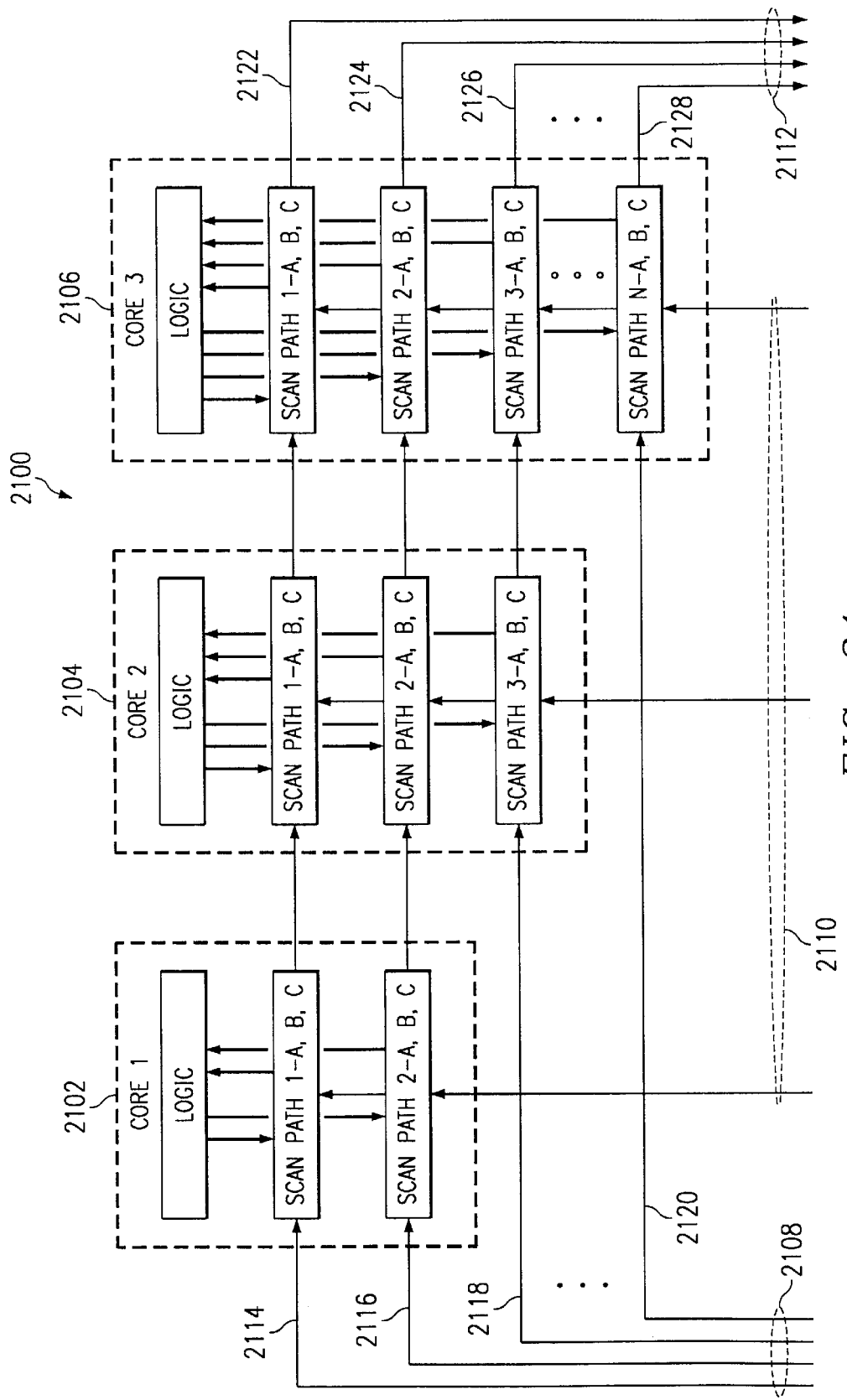
FIG. 21 is a block diagram of the circuit of FIG. 19 with scan paths according to the present invention.

FIG. 21 illustrates IC 2100, which is the IC 1900 after the scan paths of cores 1–3 of IC 1900 have been converted into low power scan paths 1–N. Besides the conversion of the conventional scan paths into low power scan paths, the IC 2100 is the same as that of IC 1900, including the scan path connections to each other and to the tester as described in regard FIGS. 18 and 20 above. The low power scan paths of FIG. 21 are assumed to each be partitioned into separate scan path segments A, B, and C, as previously described in regard to the partitioning of scan path 104 of FIG. 1 into low power scan path 502 of FIG. 5. The scan paths of cores 1–3 of FIG. 21 are connected to a control bus 2110 to synchronize their daisy-chained scan test operation. The control bus 2110 of FIG. 21 differs from the control bus of FIG. 19 in that it comes from an adaptor, such as from adaptor 504 of FIG. 5, adaptor 1210 of FIG. 12, or adaptor 1610 of FIG. 16.

During test operation, the low power scan paths of cores 1–3 are controlled to repeat the steps of: (1) performing a capture operation to load response data from their respective logic circuits, and (2) performing an adaptor controlled shift operation to unload response data to the tester via path 2112 and load the next stimulus data from the tester via path 2108. The adaptor control sequences through the operate scan paths A, B, and C states as previously described in regard to state diagram 1302 of FIG. 13. The duration of the adaptor controlled shift operation is such that the longest daisy-chained low power scan path connection (i.e. the scan path 1 and 2 connections between cores 1–3) are emptied of their captured response data and filled with their next stimulus data. From inspection of FIG. 21 it is seen that during the adaptor controlled shift operation, the logic circuits of cores-1–3 receive rippling stimulus inputs only from the currently shifting scan paths A, B, or C of each low power scan path. Thus the power consumed by the core 1–3 logic circuits in FIG. 21 during shift operations is reduced from the power consumed by the core 1–3 logic circuits of FIG. 19 during shift operations.

As previously described in regard to the test times of using scan paths 104 and 502 to test logic 108 of FIGS. 1 and 5, the test times of using the scan paths of FIGS. 18 and 20 to test the logic circuits of cores 1–3 are the same, as are the test times of using scan paths of FIGS. 19 and 21 to test the logic circuits of cores 1–3. Also, as previously described in regard to FIG. 9, the tester scan input and scan output pattern frames used for testing the FIG. 18 cores can be directly reused to test the FIG. 20 cores. Likewise, the test patterns used for testing the FIG. 19 cores can be reused to test the FIG. 21 cores.

As mentioned, the scan paths of the FIGS. 18 and 19 circuits were assumed to be of equal length (M). Also, the corresponding low power scan paths of FIGS. 20 and 21 were assumed to be modified from the M length scan paths FIGS. 18 and 19 such that the scan path segments A, B, and C of each low power scan path are of equal length (M/3). With these assumptions made, a single adaptor circuit can be used to operate all the low power scan paths of cores 1–3 of FIGS. 20 and 21 during scan operations. The single adaptor circuit would sequence through three cycles of scan burst time intervals 802, 804, and 806 of FIG. 8 during each scan operation. For example, using the scan operation timing diagram of FIG. 8 modified as described below, the scan operation of the FIGS. 20 and 21 scan paths can be understood. In FIG. 8, when SCANENA goes low at time 812 to start the scan operation, a first cycle of scan burst intervals 802–806 occurs, followed by SCANENA remaining low while a second cycle of scan burst intervals 802–806 occurs, followed by SCANENA remaining low while a third cycle of scan burst intervals 802–806 occurs. Following the third cycle of scan burst intervals 802–806 SCANENA returns high to end the scan operation.

While the adaptor may be designed to operate the low power scan paths different from the operation described above, the above described operation maintains the ability to reuse the test pattern frames of the original scan paths of FIGS. 18 and 19. For example, each of the existing scan test pattern frames (stimulus and response) for the FIGS. 18 and 19 circuit can be viewed in the format of "[core1] [core2] [core3]", where [core1] indicates the scan frame bit positions targeted for the core 1 scan paths, [core2] indicates the scan frame bit positions targeted for the core 2 scan paths, and [core3] indicates the scan frame bit positions targeted for the core 3 scan paths. It follows from the previous description given for FIG. 9 that; [core1] can be further viewed in a format of $[C_1B_1A_1]$, [core2] can be further viewed in a format of $[C_2B_2A_2]$, and [core3] can be further viewed in a format of $[C_3B_3A_3]$, where the $C_{1,2,3}$, $B_{1,2,3}$, and $A_{1,2,3}$ subset bit positions are targeted for each low power scan path segment C, B, and A of cores 1–3 of FIGS. 22 and 21. The above described adaptor scan operation would operate to load and unload each subset $C_{1,2,3}$, $B_{1,2,3}$, $A_{1,2,3}$ scan frame bit positions into the respective C, B, and A scan path segments of each low power scan path of FIGS. 20 and 21. The advantage to this, as mentioned in regard to FIG. 9, is that test pattern frames originally provided for the scan path arrangement of FIGS. 18 and 19 do not have to modified for use with the low power scan path arrangement of FIGS. 20 and 21.

As mentioned in regard to the FIG. 19 daisy-chain arrangement, length compensating pad bit positions are included in the test pattern frames communicated to the daisy-chained scan paths 3 of cores 2 and 3, and in the test pattern frames communicated to scan paths 4–N of core 3. During the adaptor operated scan operation of the FIG. 21 circuit, these pad bit positions are communicated during the above mentioned cycles of scan burst timing intervals 802–806, such that at the end of each adaptor controlled scan operation, all scan path segments A, B, C of all low power scan paths properly filled with stimulus and emptied of response.

In FIG. 20, if the A, B, C segments of the low power scan paths of core 1 have the same length, the A, B, C segments of the low power scan paths of core 2 have the same length, and the A, B, C segments of the low power scan paths of core 3 have the same length, but the lengths of the A, B, C segments of the low power scan paths of cores 1–3 are not the same, separate adaptor interfaces will be needed to control the low power scan paths of each core 1–3. A first adaptor interface will be connected to the control input 2018 of core 1 to provide control of the core 1 A, B, C segments, a second adaptor interface will be connected to the control input 2020 of core 2 to provide control of the core 2 A, B, C segments, and a third adaptor interface will be connected to the control input 2022 of core 3 to provide control of the core 3 A, B, C segments. The use of separate adaptor interfaces allows each of the core 1–3 low power scan paths to be operated according to the scan burst timing intervals (802–806) required to communicate to each of the different length low power scan path A, B, C segments of cores 1–3. For example, if the A, B, C segment lengths of cores 1, 2, and 3 were 100, 300, and 900 respectively, the scan burst intervals (802–806) of core 1 would be set at 100 each, the scan burst timing intervals (802–806) of core 2 would be set at 300 each, and the burst timing intervals (802–806) of core 3 would be set at 900 each. A single adaptor circuit may be equipped with multiple separate interfaces for connection to control inputs 2018–2022, or separate adaptor circuits may be interfaced to control inputs 2018–2022. In a daisy-chained arrangement, as in FIG. 20, each core may have different A, B, C scan segment lengths. However for proper daisy-chain operation, each of the different core A, B, C scan lengths should be set to positive integer multiples of one another such that the adpator interfaces to each core can operate together during each scan operation cycle (i.e. from SCANENA going low at 812 to SCANENA going high at 814 in FIG. 8) to modulate the test patterns through all daisy-chained cores without loosing any of the stimulus and response pattern bits. For example, the 100, 300, and 900 A, B, C core scan segment lengths mentioned above have been set to where, during each scan operation cycle, the adpator of core 1 modulates test patterns through core 1 using multiple cycles of 100 bit scan burst intervals (802–806), the adpator of core 2 modulates test patterns through core 2 using multiple cycles of 300 bit scan burst intervals (802–806), and the adaptor of core 3 modulates test patterns through core 3 using multiple cycles of 900 bit scan burst intervals (802–806). Since 900 is a multiple of 300 and 300 is a multiple of 100, all A, B, C scan paths of cores 1–3 will be properly filled and emptied during each scan operation cycle.

Scalable Scan Architecture Power Consumption

As can be anticipated from the description given for the present invention, the power consumption of logic circuitry being tested by the low power scan architecture decreases as the number separate scan paths within the low power scan paths increases. For example, configuring a given conventional scan path into a low power scan path comprising two separate scan paths may reduce power consumption by up to 50%, since, during operation, each of the two separate scan paths separately charge and discharge one half, potentially, of the logic circuitry capacitance charged and discharged by the convention scan path. Further, configuring the same conventional scan path into a low power scan path comprising three separate scan paths may reduce power consumption by up to 66%, since, during operation, each of the three separate scan paths separately charge and discharge one third, potentially, of the logic capacitance charged and discharged by the convention scan path. Still further, configuring the same conventional scan path into a low power scan path comprising four separate scan paths may reduce power consumption by up to 75%, since, during operation, each of the four separate scan paths separately charge and discharge one fourth, potentially, the logic capacitance charged and discharged by the convention scan path. From this it is seen that the present invention allows a synthesis tool to be provided with the capability of scaling the power consumption of a given synthesized scan architecture to meet a desired low power mode of test operation of a circuit.

Scalable Scan Architecture Noise Reduction

As can be anticipated from the description given for the present invention, the noise generated by logic circuitry being tested by the low power scan architecture decreases as the number of separate scan paths within the low power scan paths increases. For example, configuring a given conventional scan path into a low power scan path comprising two separate scan paths may reduce noise generation by up to 50%, since, during operation, each of the two separate scan paths separately activate only one half, potentially, of the logic circuitry activated by the conventional scan path. Further, configuring the same conventional scan path into a low power scan path comprising three separate scan paths may reduce noise generation by up to 66%, since, during operation, each of the three separate scan paths separately activate only one third, potentially, of the logic circuitry activated by the convention scan path. Still further, configuring the same conventional scan path into a low power scan path comprising four separate scan paths may reduce noise generation by up to 75%, since, during operation, each of the four separate scan paths separately activate one fourth, potentially, of the logic circuitry activated by the convention scan path. From this it is seen that the present invention allows a synthesis tool to be provided with the capability of scaling the noise generation of a given synthesized scan architecture to meet a desired low noise mode of test operation of a circuit.

Although the present invention has been described in accordance to the embodiments shown in the figures, one of ordinary skill in the art will recognize there could be variations to these embodiments and those variations should be within the spirit and scope of the present invention. Accordingly, modifications may be made by one ordinarily skilled in the art without departing from the spirit and scope of the appended claims.

I claim:

1. A scan circuit comprising:
   A. a functional circuit formed on the semiconductor substrate of an integrated circuit, the functional circuit including logic circuits to be tested;
   B. a scan path circuit formed of serially connected scan cells, the scan path circuit having leads connected to the logic circuits to carry stimulus signals to the logic circuits and to receive response signals from the logic circuits, the scan path circuit having a serial data input lead and a serial data output lead, the scan path circuit having control input leads for receiving control signals to control operation of the scan path circuit, the scan path circuit being organized in selectable, separate scan path parts, each scan path part having a serial input connected to the serial data input lead, a serial output lead selectively coupled to the serial data output lead and a separate set of control input leads;

C. a tester having a tester data output lead connected to the serial data input lead, a tester data input lead connected to the serial data output lead and control output leads coupled to the control input leads for controlling the operation of the scan path circuit; and D. adaptor circuits coupling the control output leads of the tester to the separate sets of control input leads of the scan path circuit, the adaptor circuits including input leads receiving one set of control signals from the tester and including a set of output leads providing control signals for each scan path part, the adaptor circuits including a state machine controlling the production of the separate sets of control signals for operating the respective separate scan path parts, and the adaptor circuits including counter circuits connected to the state machine.

2. The circuit of claim 1 in which the state machine has counter control outputs and at least one count input, and the counter has control inputs connected to the counter control outputs and has at least one count output connected to the count input.

3. The circuit of claim 2 in which the scan path parts have equal numbers of scan cells and there is only one count input and one count output.

4. The circuit of claim 2 in which the scan paths have unequal numbers of scan cells and there are plural count outputs.

5. The circuit of claim 2 in which the state machine has a scan clock input, a scan enable input, an enable clock output for each scan path part, and an enable buffer output for each scan path part, the adaptor circuits including a gate for each scan path part, each gate having a first input connected to an enable clock output from the state machine and the scan clock input.

* * * * *